(12) United States Patent
Mori et al.

(10) Patent No.: US 7,271,698 B2
(45) Date of Patent: Sep. 18, 2007

(54) LAMINATED FERRIMAGNETIC THIN FILM, AND MAGNETO-RESISTIVE EFFECT ELEMENT AND FERROMAGNETIC TUNNEL ELEMENT USING THIS THIN FILM

(75) Inventors: Kaoru Mori, Tokyo (JP); Atsushi Kamijo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/896,082

(22) Filed: Jul. 22, 2004

(65) Prior Publication Data

US 2004/0257192 A1 Dec. 23, 2004

Related U.S. Application Data

(62) Division of application No. 10/423,014, filed on Apr. 25, 2003.

(30) Foreign Application Priority Data

Apr. 26, 2002 (JP) ............................. 2002-127656

(51) Int. Cl.
*H01L 43/00* (2006.01)
(52) U.S. Cl. .................. 338/32 R; 360/324.1; 428/692
(58) Field of Classification Search .............. 338/32 R; 360/324.12, 324.1; 428/332, 692, 693, 694; 324/252; 480/332, 692–694
See application file for complete search history.

(56) References Cited

U.S. PATENT DOCUMENTS 5,159,513 A 10/1992 Dieny et al.
5,341,118 A 8/1994 Parkin et al.
5,408,377 A * 4/1995 Gurney et al. ............ 338/21 R
5,465,185 A 11/1995 Heim et al.
5,650,958 A 7/1997 Gallagher et al.
5,932,343 A * 8/1999 Hayashi et al. ............ 428/332
6,258,470 B1 * 7/2001 Sakakima et al. ........ 338/32 R (Continued)

FOREIGN PATENT DOCUMENTS

JP 2001-52317 2/2001
JP 2001-143223 5/2001

OTHER PUBLICATIONS

S.S. P. Parkin, "Systematic Variation of the Strength and Oscillation Period of Indirect Magnetic Exchange Coupling through the 3d, 4d, and 5d Transition Metals", *Physical Review Letters*, vol. 67, No. 25, Dec. 16, 1991, pp. 3598-3601.

(Continued)

*Primary Examiner*—Richard K. Lee
(74) *Attorney, Agent, or Firm*—McGinn IP Law Group, PLLC

(57) ABSTRACT

A laminated ferrimagnetic thin film consists of two ferromagnetic layers and a non-magnetic intermediate layer sandwiched therebetween. The respective ferromagnetic layers are magnetically coupled in an antiferromagnetic manner through the non-magnetic intermediate layer. Each ferromagnetic layer consists of a plurality of layers. In each ferromagnetic layer, a layer which is in contact with the non-magnetic intermediate layer is formed of Co or an alloy including Co while at least one layer is formed of Ni or an alloy including Ni, and its film thickness is determined to be at least 60% or more of a film thickness of each ferromagnetic layer.

16 Claims, 20 Drawing Sheets

U.S. PATENT DOCUMENTS

| | | | |
|---|---|---|---|
| 6,338,899 B1* | 1/2002 | Fukuzawa et al. | 338/32 R |
| 6,407,890 B1* | 6/2002 | Gill | 360/324.1 |
| 6,562,486 B2* | 5/2003 | Sakakima et al. | 338/32 R |
| 6,636,391 B2 | 10/2003 | Watanabe et al. | |
| 6,690,163 B1* | 2/2004 | Hoshiya et al. | 324/252 |
| 6,765,769 B2* | 7/2004 | Mizuguchi | 360/324.1 |
| 2001/0030842 A1* | 10/2001 | Pinargasi et al. | 360/324.11 |
| 2001/0036046 A1 | 11/2001 | Mizuguchi | |
| 2003/0011463 A1* | 1/2003 | Iwasaki et al. | 338/32 R |

OTHER PUBLICATIONS

H.A.M. van den Berg, et al., "GMR angle detector with an artificial antiferromagnetic subsystem (AAF)", *Journal of Magnetism and Magnetic Materials*, vol. 165 (1997), pp. 524-528.

K. Pettit, et al., "Strong biquadratic coupling and antiferromagnetic-ferromagnetic crossover in NiFe/Cu multilayers", *Physical Review B*, American Physical Society, vol. 56, No. 13, Oct. 1, 1997, pp. 7819-7822.

C. Tiusan, et al., "Artificial antiferromagnetic tunnel junction sensors based on Co/Ru/Co sandwiches", *Journal of Applied Physics*, American Institute of Physics, vol. 85, No. 8, Apr. 15, 1999, pp. 5276-5278.

J. Fassbender, et al., "Oscillatory interlayer exchange coupling of Co/Ru and permalloy/Ru multilayers investigated by Brillouin light scattering a) (abstract)" *Journal of Applied Physics*, American Institute of Physics, vol. 73, No. 10, May 15, 1993, p. 5986.

* cited by examiner

LAMINATED FERRIMAGNETIC THIN FILM, AND MAGNETO-RESISTIVE EFFECT ELEMENT AND FERROMAGNETIC TUNNEL ELEMENT USING THIS THIN FILM

The present Application is a Divisional Application of U.S. patent application Ser. No. 10/423,014 filed on Apr. 25, 2003.

This application claims priority to prior application JP Appln. No. 2002-127656, the disclosure of which is incorporated herein by reference.

BACKGROUND OF THE INVENTION

The present invention relates to a laminated ferrimagnetic thin film having a magnetization reversion characteristic suitable for a free magnetic layer of a magneto-resistive effect element or a ferromagnetic tunnel junction element, and a magneto-resistive effect element and a ferromagnetic tunnel element using this thin film.

The magneto-resistive effect is a phenomenon that an electric resistance varies based on an external magnetic field. A magneto-resistive effect element senses a magnitude of the external magnetic field applied to the element as a change in an element resistance value, or has a function to hold this state as a magnitude of the element resistance value. In particular, there are many expectations to application of a spin valve type GMR element and a ferromagnetic tunnel junction element each having a large magnetoresistive change ratio (MR ratio) in a low external magnetic field area at a room temperature to a high recording density compatible reproduction magnetic head and a high density solid-state magnetic memory (MRAM).

These magneto-resistive effect elements consist of a free magnetic layer capable of setting a magnetization direction free with respect to the external magnetic field, a pinned magnetic layer including a mechanism to fix a magnetization direction to the external magnetic field, and a non-magnetic layer which is arranged between and comes into contact with these layers. The magneto-resistive effect occurs when a resistance of the element varies due to a relative magnetization angle of the magnetic layers on the both sides with the non-magnetic layer sandwiched therebetween. Substantially eliminating the magnetic coupling between the free magnetic layer and the pinned magnetic layer realizes a so-called spin valve type element operation that only a magnetization direction of the free magnetic layer varies with respect to the external magnetic field, and obtains the magneto-resistive effect sensitive to the external magnetic field.

As magnetic materials (ferromagnetic substances), there are widely known Co, Ni, Fe and alloys of these materials. In particular, Co or an alloy including Co, especially a CoFe alloy has a feature of large saturation magnetization, and Ni or an alloy including Ni, especially an NiFe alloy has a feature of a excellent soft magnetic characteristic (low coercive force). As free magnetic layer materials of the magneto-resistive effect element, a magnetically soft (superior in a soft magnetic characteristic) magnetic material like NiFe is suitable and widely used because of the need to quickly perform magnetization reversion in a small external magnetic field.

Further, as to a mechanism which fixes a magnetization direction of the pinned magnetic layer to an external magnetic field, there are employed a method (coercive force difference type) which uses a magnetic material which is magnetically hard as a material and makes its reverting coercive force larger than that of the free magnetic layer, and a method (exchange biased type) which further positively fixes the magnetization direction to one direction by bringing an anti-ferromagnetic layer into contact with a pinned magnetic layer.

The element which uses a non-magnetic conductor such as Cu, Ag and Au as a non-magnetic layer is a spin valve type GMR element typically disclosed in U.S. Pat. No. 5,159,513, and an element which uses a non-magnetic insulator such as an Al oxide or an Al nitride as a non-magnetic layer is a ferromagnetic tunnel junction element typically disclosed in U.S. Pat. No. 5,650,958. A higher MR ratio can be obtained in the latter element rather than the former element. Furthermore, the both elements has a difference in direction along which an electric current is passed. Since the in-plane high integration of the element is important for an application to a high density solid-state magnetic memory (MRAM), the ferromagnetic tunnel junction element which has a higher MR ratio and performs energization in a direction vertical to the plane is more preferable.

On the other hand, as one of thin film structures which can be applied to the ferromagnetic layer (the free magnetic layer or the pinned magnetic layer) in these magneto-resistive effect elements, there is a multi-layer magnetic film which is called a laminated ferrimagnetic thin film. As apparent from the basic structure disclosed in U.S. Pat. No. 5,341,118, this is a multi-layer thin film consisting of at least two ferromagnetic layers and a non-magnetic intermediate layer which is arranged between and in contact with the ferromagnetic layers. When a non-magnetic transition metal which is preferable as a non-magnetic intermediate layer material is used, the extremely strong anti-ferromagnetic interaction (exchange bonding) acts on the both ferromagnetic layers through the non-magnetic intermediate layer, and their magnetization directions are always anti-parallel in a low magnetic field. Therefore, the magnetic moments of the respective ferromagnetic layers constituting the laminated ferrimagnetic thin film are always canceled out, and it is possible to realize an artificial ferrimagnetic state having a small magnetic moment corresponding to a difference in film thickness between the respective ferromagnetic layers. In the laminated ferrimagnetic thin film, the magnetic film thickness can be effectively greatly reduced without extremely decreasing the film thickness of each ferromagnetic layer.

The magnitude of the anti-ferromagnetic exchange bonding between the ferromagnetic layers in the laminated ferrimagnetic thin film depends on a material and a film thickness of the non-magnetic intermediate layer. Physical Review Letters, Vol. 67, p. 3598 (1991) describes that the intensity of the antiferromagnetic exchange bonding between the ferromagnetic layers in the laminated ferrimagnetic thin film depends on a non-magnetic intermediate layer material and the periodic vibrations are demonstrated with respect to a film thickness of the non-magnetic intermediate layer material. It also mentions that, in the laminated ferrimagnetic thin film which has a simple sandwich structure that the number of times of repetition=1 and in which film thicknesses of the respective ferromagnetic layers are equal to each other, assuming that $H_S$ is a saturation magnetic field, $M_S$ is saturation magnetization of the ferromagnetic layer to be used and t is a film thickness of the ferromagnetic layer, the bonding intensity (J: anti-ferromagnetic exchange bonding energy) can be obtained based on $J = H_S \times M_S \times t/2$. In this report, there is described the relationship between the anti-ferromagnetic exchange bonding intensity and many non-magnetic intermediate layer materials when Co is used as the ferromagnetic layer, as well as the tendency that the magnitude of the ferromagnetic exchange bonding energy increases in the order of a 5d group transition metal, a 4d group transition metal and a 3d group transition metal as the non-magnetic intermediate layer material and that it also increases as a quantity of outermost shell d electrons becomes larger in the same cycle. Among others, Ru, Rh, Ir and Cu have the antiferromagnetic exchange bonding energy of up to $10^{-3}$ J/m$^2$ (1 erg/cm$^2$), which is considerably larger than that of any other element. It is to be noted that, according to Journal of Magnetism and Magnetic Materials, Vol. 165, p. 524 (1997), assuming that $t_1$ and $t_2$ are the respective ferromagnetic layer film thicknesses, the antiferromagnetic exchange bonding energy when the respective ferromagnetic layers have different film thicknesses can be given by $J=H_S \times MS \times t_1 \times t_2/(t_1+t_2)$.

It is known that the exchange bonding intensity of the laminated ferrimagnetic layer also depends on a material for the ferromagnetic layer to be used. Physical Review B, Vol. 56, p. 7819 (1997) mentions that the antiferromagnetic exchange bonding energy when Cu is used as the nonmagnetic intermediate layer and NiFe is used as the ferromagnetic layer is not more than $J=6\times10^{-5}$ J/m$^2$ (0.06 erg/cm$^2$), but this value is far smaller than that obtained when Co is used as the ferromagnetic layer. Further, Journal of Applied Physics, Vol. 73, p. 5986 (1993) mentions that the exchange bonding intensity becomes smaller when NiFe (perm alloy) is used as the ferromagnetic layer rather than Co, and points out the possibility of the influence of the fact that the saturation magnetization of NiFe is smaller than that of Co. Japanese patent application laid-open No. 143223/2001 discloses a film thickness range of the non-magnetic intermediate layers (Ru, Cr, Ir and Rh) by which the magnitude of a saturation magnetic field to be obtained is preferable when NiFe and Co are used as the ferromagnetic layer material in the laminated ferrimagnetic thin film. By using the relationship between the saturation magnetic field disclosed herein and the non-magnetic intermediate layer film thickness, the relationship between the saturation magnetization of each ferromagnetic layer material and its film thickness, and a relational expression of the anti-ferromagnetic exchange bonding energy J and the saturation magnetic field $H_S$ mentioned above ($J=H_S \times M_S \times t_1 \times t_2/(t_1+t_2)$), the non-magnetic intermediate layer film thickness dependence of each antiferromagnetic exchange bonding intensity when the ferromagnetic layer materials are NiFe and Co can be obtained.

FIGS. 1 and 2 are graphs showing the relationship between the antiferromagnetic exchange bonding energy of NiFe and Co obtained by the above method and film thicknesses of the non-magnetic intermediate layers (Ru, Rh, Ir).

Description will now be given as to a prior art concerning the application of the laminated ferrimagnetic thin film to the magneto-resistive effect element. The magneto-resistive effect element having a laminated ferri type pinned magnetic layer will be first explained. In the magneto-resistive effect element, as described above, in order to subject the free magnetic layer to magnetization reversion in accordance with a change in an external magnetic field (in order to cause the magneto-resistive effect element to operate in the spin valve manner), the magnetic effect acting between the free magnetic layer and the pinned magnetic layer must be reduced to substantially zero. When the laminated ferrimagnetic thin film is applied to the pinned magnetic layer, however, the influence of the pinned magnetic layer on magnetization reversion of the free magnetic layer can be further reduced. The basic structure of the magneto-resistive effect element having the laminated ferri type pinned magnetic layer is disclosed in U.S. Pat. No. 5,465,185. Usually, in the magneto-resistive effect element, the phenomenon that a fixed amount of the reverting magnetic field of the free magnetic layer is shifted can be observed due to the influence of the static magnetic field formed by the magnetic charge of an end of the pinned magnetic layer. In the magneto-resistive effect element having the laminated ferri type pinned magnetic layer, however, the static magnetic field formed by the pinned magnetic layer can be minimized by the magnetic thin film reducing effect of the pinned magnetic layer, thereby reducing the shift of the reverting magnetic field of the free magnetic layer. In the magneto-resistive effect element having the laminated ferri type pinned magnetic layer, an improvement to make the pinned magnetic layer more preferable (the magnetic effect of the pinned magnetic layer acting on the free magnetic layer is further reduced) has been advanced. For example, Japanese patent application laid-open No. 052317/2001 discloses a method by which grain growth is suppressed due to the buffer effect by realizing the three-layer structure with an appropriate material and film thickness of a ferromagnetic layer on a free magnetic layer side of two ferromagnetic layers constituting a laminated ferri type pinned magnetic layer, thereby smoothing the top face of the pinned magnetic layer on the free magnetic layer side. As a result, the direct ferromagnetic coupling (which is generally called nail coupling) due to roughness acting between the pinned magnetic layer and the free magnetic layer can be reduced. In such a laminated ferri type pinned magnetic layer, it is know that there is also an advantage to make the pinned magnetic layer magnetically more hard as well as the above-described advantages. That is, in the magneto-resistive effect element having the laminated ferri type pinned magnetic layer, since the pinned magnetic layer is hard to be reverted with respect to the external magnetic field, it is further preferable as the pinned magnetic layer whose magnetization direction must be fixed. Journal of Applied Physics, Vol. 85, p. 5276 reports the coercive force difference type ferromagnetic tunnel junction.

The magneto-resistive effect element having the laminated ferrimagnetic layer will now be described. Its basic structure is disclosed in U.S. Pat. No. 5,408,377. The advantage of using the laminated ferrimagnetic thin film for the free magnetic layer lies in that reducing an effective magnetic film thickness of the free magnetic layer can decrease the magnitude of a demagnetizing field formed by the free magnetic layer itself which is in proportion to the magnetic film thickness. The reverting magnetic field of the micro-fabricated free magnetic layer is increased in inverse proportion to an element size due to the effect of the demagnetizing field, but the magnetoresistive effect element using the laminated ferri type free magnetic layer can reduce the reverting magnetic field. As a result, in a magnetic head, the magnetic field sensitivity of a fine element can be improved. Also, in a solid-state magnetic memory, the switching magnetic field of the fine element can be reduced, thereby enabling power saving.

Thus, realizing minuteness of an element size is required with respect to a demand for the high recording density of a reproduction magnetic head and a demand for the high integration of a solid-state magnetic memory, and it is expected that suppression of an increase in the reverting magnetic field of the free magnetic layer caused due to the above-described realization of minuteness becomes very important in future. As different from the pinned magnetic layer, however, there is almost no improvement report about the magneto-resistive effect element in which the laminated ferrimagnetic thin film is applied with respect to the free magnetic layer.

However, in the prior art laminated ferrimagnetic thin film, the large anti-ferromagnetic exchange bonding energy can be readily obtained when Co or CoFe is used as a ferromagnetic layer material, but it is difficult to produce the large anti-ferromagnetic exchange bonding energy by using Ni or NiFe. Referring to FIG. 2, when Co is used as a ferromagnetic layer material, the large anti-ferromagnetic exchange bonding energy can be obtained in a large non-magnetic intermediate layer thin film range of approximately 0.6 nm if the non-magnetic intermediate layer is formed of Ru, Ir or Rh. However, referring to FIG. 1, the non-magnetic intermediate layer film thickness range in which the large anti-ferromagnetic exchange bonding energy of not less than, e.g., $10^{-3}$ J/m$^2$ (1 erg/cm$^2$) when NiFe is used does not exist if the non-magnetic intermediate layer is formed of Ru or Ir. Further, in case of Rh, this range is not more than 0.1 nm, which is very narrow. Namely, when Ni or NiFe is used as a ferromagnetic layer material, very precise control over the non-magnetic intermediate layer film thickness is required as compared with the case that Co or CoFe is used. When applying to a device, irregularities in film thickness between lots or in a wafer must be taken into consideration, which results in a serious problem. As the laminated ferrimagnetic thin film suitable for the free magnetic layer in the magneto-resistive effect element, there is required the laminated ferrimagnetic thin film which can simultaneously realize the large anti-ferromagnetic exchange bonding energy and the excellent soft magnetic characteristic equivalent to that of Ni or NiFe and does not require precise control of the non-magnetic intermediate layer film thickness.

SUMMARY OF THE INVENTION

It is therefore an object of the present invention to provide a laminated ferrimagnetic thin film which can simultaneously realize the large antiferromagnetic exchange bonding energy and the excellent soft magnetic characteristic and does not require precise control of a non-magnetic intermediate layer film thickness.

It is another object of the present invention to provide a magnetoresistive effect element and a ferromagnetic tunnel junction element which have steep magnetization reversion of a free magnetic layer and a low coercive force, and can be readily manufactured.

A laminated ferrimagnetic thin film according to the present invention consists of a first ferromagnetic layer, a second ferromagnetic layer and a non-magnetic intermediate layer which is arranged between these layers and in contact with them, the first ferromagnetic layer and the second ferromagnetic layer being magnetically coupled through the non-magnetic intermediate layer in the anti-ferromagnetic manner.

According to a first aspect of the present invention, there is provided a laminated ferrimagnetic thin film comprising: a first main ferromagnetic layer in which the first ferromagnetic layer consists of at least one layer; and a first interface ferromagnetic layer which is arranged between the first main ferromagnetic layer and the non-magnetic intermediate layer and in contact with them. Further, it also comprises a second main ferromagnetic layer in which the second ferromagnetic layer consists of at least one layer, and a second interface ferromagnetic layer which is arranged between the second main ferromagnetic layer and the non-magnetic intermediate layer and in contact with them. Each of the first interface ferromagnetic layer and the second interface ferromagnetic layer is formed of Co or an alloy including Co. Each of at least one layer in the first main ferromagnetic layer and at least one layer in the second main ferromagnetic layer is formed of a soft magnetic film, and a total film thickness of layers consisting of soft magnetic layers in the first main ferromagnetic layer is not less than 60% of a film thickness of the first ferromagnetic layer, and a total film thickness of layers consisting of soft magnetic layers in the second main ferromagnetic layer is not less than 60% of a film thickness of the second ferromagnetic layer.

According to a second aspect of the present invention, there is provided a laminated ferrimagnetic thin film, wherein the first ferromagnetic layer consists of two layers, i.e., a first main ferromagnetic layer and a first interface ferromagnetic layer which is arranged between the first main ferromagnetic layer and the non-magnetic intermediate layer and in contact with them. The second ferromagnetic layer consists of two layers, i.e., a second main ferromagnetic layer and a second interface ferromagnetic layer which is arranged between the second main ferromagnetic layer and the non-magnetic intermediate layer and in contact with them. Each of the first interface ferromagnetic layer and the second interface ferromagnetic layer is formed of Co or an alloy including Co. Each of the first main ferromagnetic layer and the second main ferromagnetic layer is formed by a soft magnetic film. A film thickness of the first main ferromagnetic layer is not less than 60% of a film thickness of the first ferromagnetic layer, and a film thickness of the second main ferromagnetic layer is not less than 60% of a film thickness of the second ferromagnetic layer.

In such a laminated ferrimagnetic thin film, e.g., the non-magnetic intermediate layer is formed of one type of metal selected from a group including Ru, Rh, Ir and Cu, or an alloy having as a main component one type selected from a group including Ru, Rh, Ir and Cu.

Furthermore, the alloy including Co is, e.g., a Co—Fe alloy or a $Co_X Fe_{1-X}$ ($0.75 \leq X < 1$) alloy. Moreover, the soft magnetic film is, e.g., Ni or an alloy including Ni. In this case, the soft magnetic film is formed of, e.g., an Ni—Fe alloy or an $Ni_X Fe_{1-X}$ ($0.35 \leq X < 1$) alloy.

On the other hand, according to the present invention, there is provided a magneto-resistive effect element comprising: a free magnetic layer which can freely change a magnetization direction with respect to an external magnetic field; a pinned magnetic layer including a mechanism to fix its magnetization direction with respect to the external magnetic field; and a non-magnetic layer which is arranged between the free magnetic layer and the pinned magnetic layer and in contact with them, an element resistance being changed by application of the external magnetic field, wherein the free magnetic layer is the laminated ferrimagnetic thin film.

In addition, according to the present invention, there is provided a ferromagnetic tunnel junction element comprising: a free magnetic layer which can freely change its magnetization direction with respect to an external magnetic field; a pinned magnetic layer including a mechanism which fixes its magnetization direction with respect to the external magnetic field; and a non-magnetic insulating layer which is arranged between the free magnetic layer and the pinned magnetic layer and in contact with them, an element resistance being changed by application of the external magnetic field, wherein the free magnetic layer is a laminated ferrimagnetic thin film according to any of claims 1 to 8.

The present inventors revealed that it is necessary to simultaneously realize that an anti-ferromagnetic exchange bonding energy between the two ferromagnetic layers constituting the synthetic ferri type free magnetic layer is large and that the entire ferromagnetic layer is formed of a material superior in a soft magnetic characteristic which is equivalent to Ni or an alloy including Ni (e.g., NiFe) in order to obtain a small reverting coercive force suitable for the laminated ferri type free magnetic layer in the magneto-resistive effect element through various examinations and experiments on the laminated ferrimagnetic thin film having the magnetization reversion characteristic suitable for the laminated ferri type free magnetic layer in the magnetoresistive effect element.

Specifically, the present inventors paid attention to a structure, a material and a film thickness of the ferromagnetic layer in the laminated ferrimagnetic thin film and conducted various kinds of experiments. As a result, they discovered that it is possible to readily obtain the laminated ferrimagnetic thin film (without performing precise non-magnetic intermediate layer film thickness control) which can realize both the large antiferromagnetic exchange bonding energy and the excellent soft magnetic characteristic by using a material of the non-magnetic intermediate layer and a structure, a material and a film thickness of the ferromagnetic layer described in appended claims, thereby bringing the present invention to completion.

The laminated ferrimagnetic thin film according to the present invention can simultaneously realize both the anti-ferromagnetic exchange coupling between the ferromagnetic layers having stiffness equivalent to a Co/Ru/Co-based material and a large margin relative to the non-magnetic intermediate layer film thickness, and the excellent soft magnetic characteristic equivalent to that of an Ni-based magnetic material.

Therefore, according to the present invention, it is possible to readily obtain the laminated ferrimagnetic thin film which has a magnetic characteristic (rapid magnetization reversion with a small coercive force) suitable for the free magnetic layer in the magneto-resistive effect element (without performing precise non-magnetic intermediate layer film thickness control).

Additionally, since the magneto-resistive effect element and the ferromagnetic tunnel junction element according to the present invention are characterized in use of the laminated ferrimagnetic thin film of the present invention for the free magnetic layer, the preferable magnetic characteristic (the magnetization reversion of the free magnetic layer is rapid and has a low coercive force) can be readily obtained.

DESCRIPTION OF THE PREFERRED EMBODIMENTS

Preferred embodiments according to the present invention will now be concretely described hereinafter with reference to the accompanying drawings.

First Embodiment

Figure 3:
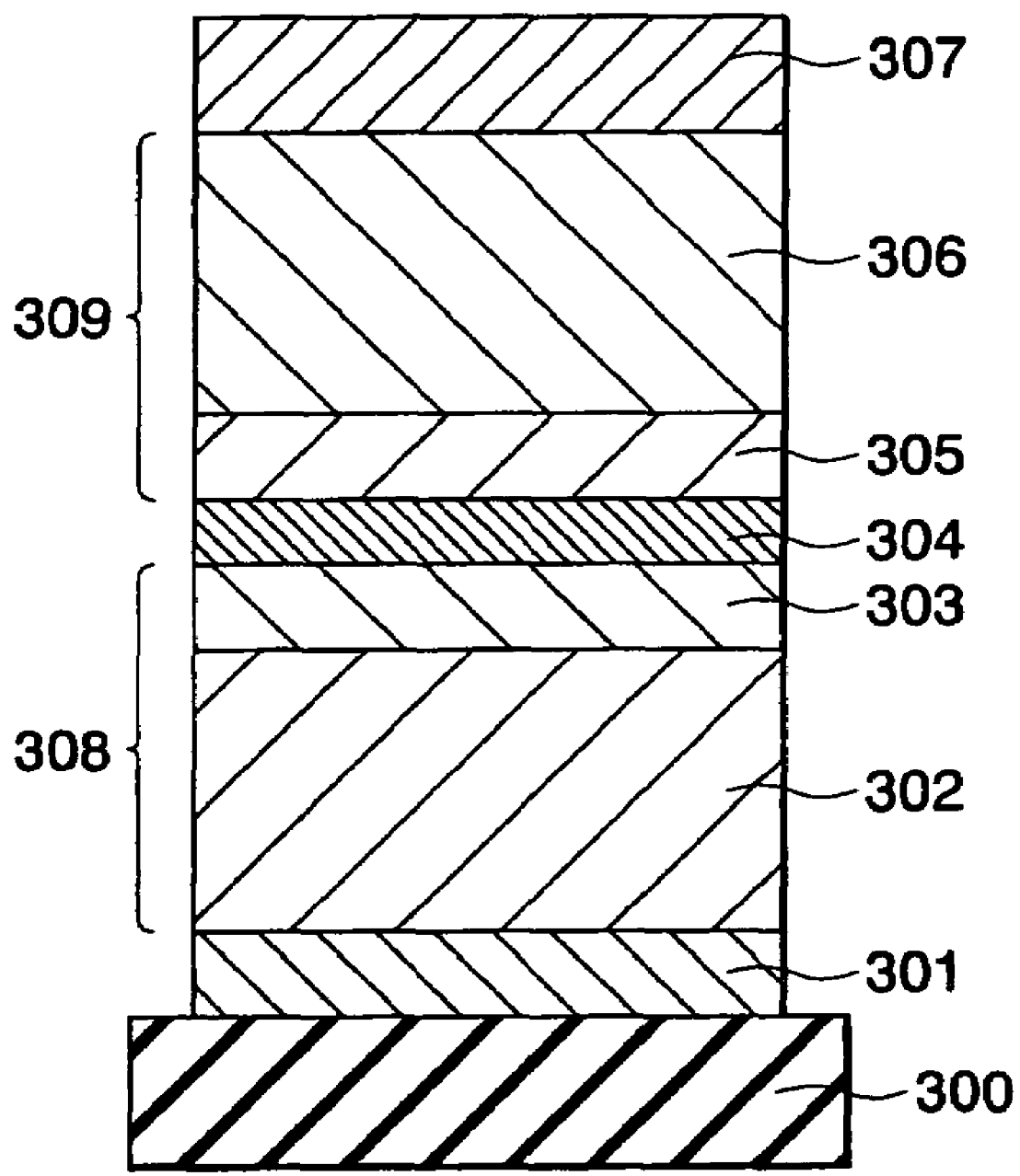
FIG. 3 is a cross-sectional view showing a basic film structure of a laminated ferrimagnetic thin film according to a first embodiment.

Referring to FIG. 3, a buffer layer 301 is formed on a substrate 300, and on the buffer layer 301 are superimposed a first main ferromagnetic layer 302, a first interface ferromagnetic layer 303, a non-magnetic intermediate layer 304, a second interface ferromagnetic layer 305, a second main ferromagnetic layer 306 and a cap layer 307 in the mentioned order.

A material constituting the non-magnetic intermediate layer is any non-magnetic transition metal of Ru, Rh, Ir and Cu, or an alloy having as a main component any of these elements.

A material of each of the first interface ferromagnetic layer 303 and the second interface ferromagnetic layer 305 is Co or an alloy including Co. As an alloy including Co, Co—Fe, Co—Cr, Co—Cu, Co—Pt, Co—Mn and others are preferable. Among others, Co—Fe is most preferable. Further, its composition is determined as $Co_XFe_{1-X}$ ($0.75 \leq X < 1$), and it is more preferable to set a Co composition X to 75 atom % or above.

A film thickness of each of the first interface ferromagnetic layer 303 and the second interface ferromagnetic layer 305 is at least not less than 0.1 nm.

A material of each of the first main ferromagnetic layer 302 and the second main ferromagnetic layer 306 is a soft magnetic film of Ni or an Ni alloy. Specifically, as a soft magnetic film of an Ni alloy, there are Ni—Fe, Ni—Fe—Mo, Ni—Fe—Nb, Ni—Fe—B, Ni—Fe—Cr—Cu, Ni—Fe—Co, Ni—Co and others. Above all, Ni—Fe is particularly superior in the soft magnetism and thus preferable. Furthermore, if a perm alloy ($Ni_XFe_{1-X}$ ($0.35 \leq X < 1$)) is used and an Ni composition X is determined as 35 atom % or above, the coercive force can be reduced to 79 A/m (1 (Oe)) or below. This soft magnetic film has a smaller coercive force than that of Co or a Co alloy constituting the first and second interface ferromagnetic layers 303 and 305 and has the excellent soft magnetic characteristic.

In this embodiment, each of the first main ferromagnetic layer 302 and the second main ferromagnetic layer 306 is a single layer, and its overall thickness is formed by a soft magnetic film. Therefore, a film thickness of the first main ferromagnetic layer 302 is not less than 60% of a film thickness of the first ferromagnetic layer 308, and a film thickness of the second main ferromagnetic layer 306 is not less than 60% of a film thickness of the second ferromagnetic layer 309. However, an upper limit value of the film thickness of the first main ferromagnetic layer 302 or the second main ferromagnetic layer 306 is obtained by subtracting a thickness of the first interface ferromagnetic layer 303 or the second interface ferromagnetic layer 305 from the first ferromagnetic layer 308 or the second ferromagnetic layer 309, respectively.

Ta, Zr, Ti or the like is used for the buffer layer 301. However, any other material can be used as long as it has a function to enhance the contact between the first main ferromagnetic layer 302 and the substrate 300. Moreover, the buffer layer 301 may not be formed in some cases.

Ta, Zr, Ti, Al or the like is used for the cap layer 307. However, any other material can be used as long as it can prevent the surface of the second main ferromagnetic layer 306 from being deteriorated due to exposure to the air. In addition, the cap layer 307 may not be formed in some cases.

The first main ferromagnetic layer 302 and the first interface ferromagnetic layer 303 constitute the first ferromagnetic layer 308, and the second main ferromagnetic layer 306 and the second interface ferromagnetic layer 305 constitute the second ferromagnetic layer 309. The first ferromagnetic layer 308 and the second ferromagnetic layer 309 are magnetically coupled in such a manner that directions of their magnetic moments become anti-parallel to each other by the anti-ferromagnetic exchange bonding effect through the non-magnetic intermediate layer 304.

An operation of the magnetic laminated ferrimagnetic thin film having the above-described structure will now be described. When the laminated ferrimagnetic thin film according to this embodiment is used as a free magnetic layer in, e.g., a magneto-resistive effect element or a ferromagnetic tunnel element, a first interface ferromagnetic layer 604 and a second interface ferromagnetic layer 606 each of which consists of Co or a Co alloy are superimposed with a non-magnetic intermediate layer 605 therebetween, thereby obtaining the very excellent coupling characteristic. Furthermore, since the first ferromagnetic layer 308 and the second ferromagnetic layer 309 are formed by a first main ferromagnetic layer 302 and a second main ferromagnetic layer 306 consisting of Ni or an Ni alloy that 60% or more of their film thickness is a soft magnetic film, the entire ferromagnetic layer can acquire the soft magnetic characteristic equivalent to that obtained when the conventional ferromagnetic layer consisting of an NiFe alloy or the like is used.

Figure 1:
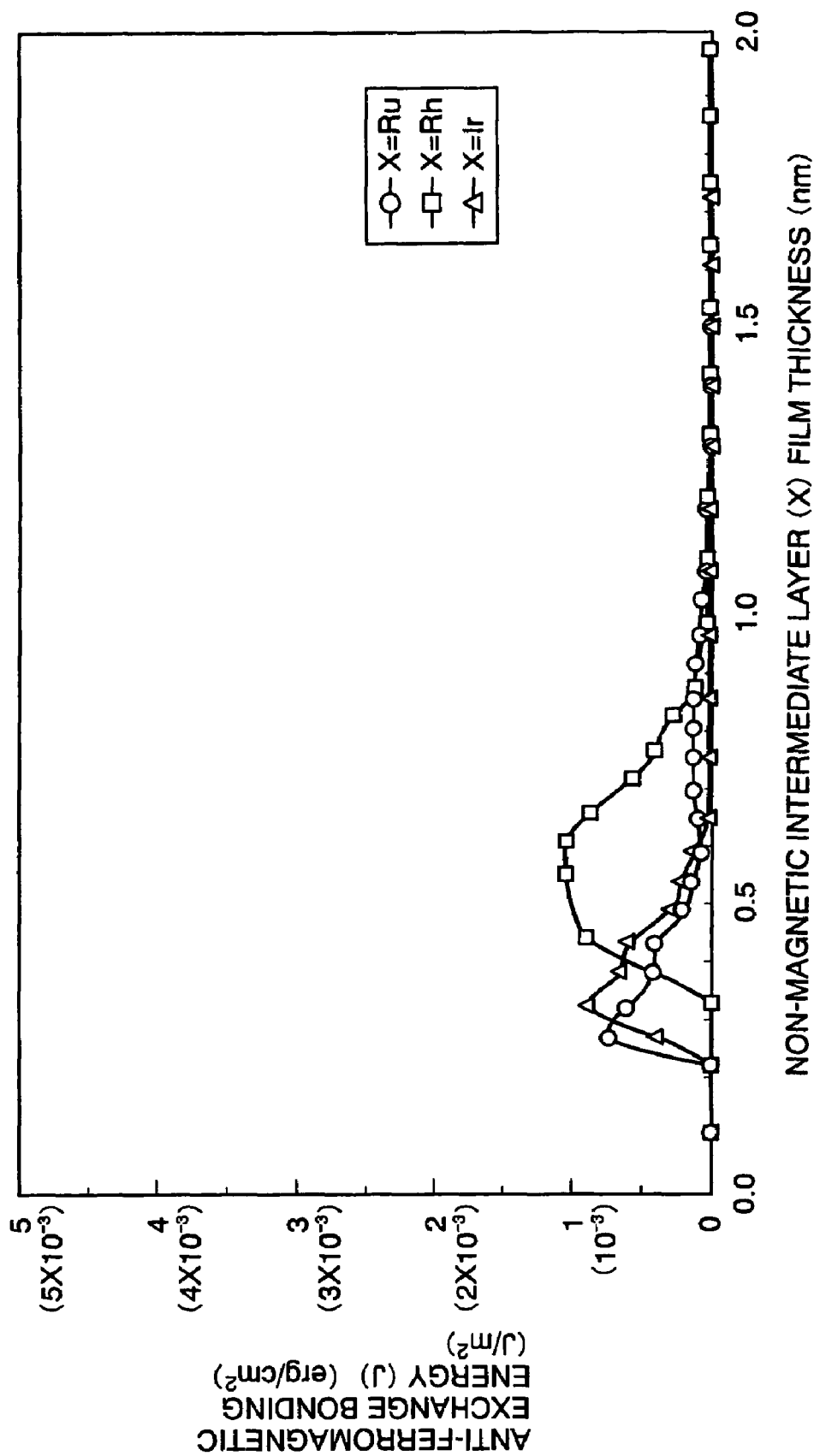
FIG. 1 is a view showing a relationship between an anti-ferromagnetic exchange bonding energy and a non-magnetic intermediate layer film thickness of a prior art laminated ferrimagnetic thin film using NiFe for a ferromagnetic layer.
Figure 2:
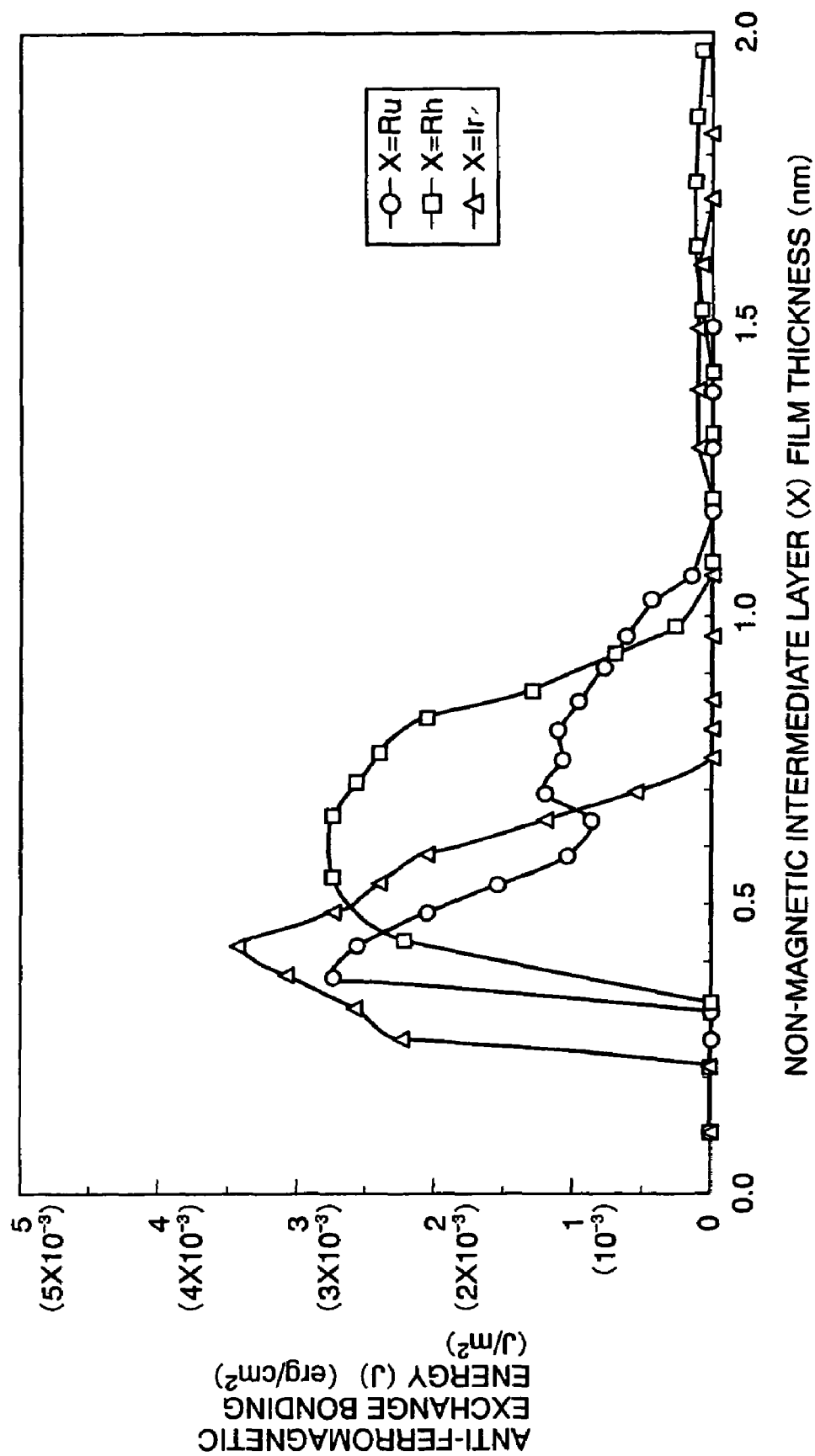
FIG. 2 is a view showing a relationship between an anti-ferromagnetic exchange bonding energy and a non-magnetic intermediate layer film thickness of a prior art laminated ferrimagnetic thin film using Co for a ferromagnetic layer.

Since each of the first interface ferromagnetic layer 303 and the second interface ferromagnetic layer 305 is formed of Co or an Co alloy, as shown in FIG. 2, the anti-ferromagnetic exchange bonding energy is increased in a range that the film thickness of the non-magnetic intermediate layer 304 is large, and a selection range of a thickness of the non-magnetic intermediate layer where the anti-ferromagnetic exchange bonding energy of not less than $10^{-3}$ $J/m^2$ (1 $erg/cm^2$) can be obtained is wide. Therefore, there is no problem if the accuracy of the thickness is low when forming the non-magnetic intermediate layer. It is to be noted that, when the ferromagnetic layer consists of an NiFe alloy, the anti-ferromagnetic exchange bonding energy is low as shown in FIG. 1, and a range of the thickness with which the bonding energy of $10^{-3}$ $J/m^2$ (1 $erg/cm^2$) can be obtained is approximately 0.47 to 0.6 nm and very narrow even if Rh is used as the non-magnetic intermediate layer. Therefore, in order to obtain the bonding energy of this level, the thickness of the non-magnetic intermediate layer must be accurately formed so as to fall within the above-described range. Accordingly, the magnetic laminated ferrimagnetic thin film according to this embodiment can be readily manufactured, and it is possible to easily produce the magnetic laminated ferrimagnetic thin film with the high performance. Moreover, in this embodiment, since the ferromagnetic layer is a two-layer superimposed body including the interface ferromagnetic layer consisting of Co or a Co alloy and the main ferromagnetic layer 302 or 306 consisting of Ni or an Ni alloy which has a smaller coercive force than that of Co or a Co alloy and is a soft magnetic film superior in the soft magnetic film, the soft magnetic characteristic is excellent, and the memory effect of the magnetic spin as a free magnetic layer is also good.

It is to be noted that the above-described magnetic laminated ferrimagnetic thin film can be combined with a pinned magnetic layer as will be described later and used as a free magnetic layer in a magneto-resistive effect element or a ferromagnetic tunnel element. In addition, when the magnetic laminated ferrimagnetic thin film is formed of a material and with a film thickness shown in FIG. 7, it has a characteristic illustrated in FIG. 8 as will be described later.

Therefore, this magnetic laminated ferrimagnetic thin film can be solely used as, e.g., a magnetic shield.

Second Embodiment

Figure 4:
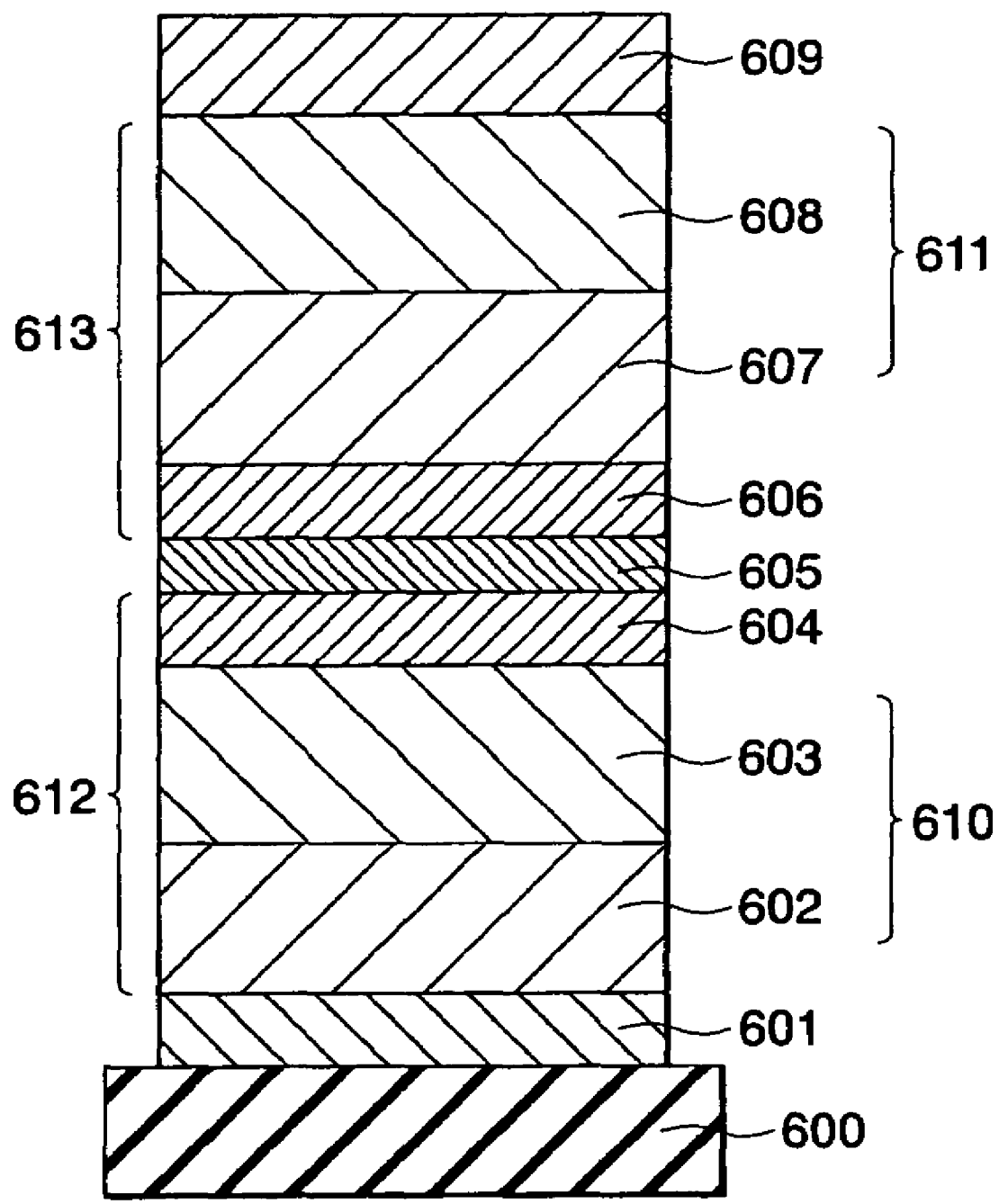
FIG. 4 is a cross-sectional view showing a basic film structure of a laminated ferrimagnetic thin film according to a second embodiment.

A second embodiment according to the present invention will now be described. Although this laminated ferrimagnetic thin film basically has the same structure as the laminated ferrimagnetic thin film shown in FIG. 3, the laminated ferrimagnetic thin film according to the second embodiment is different from the laminated ferrimagnetic thin film according to the first embodiment shown in FIG. 3 in that either or both of the first main ferromagnetic layer and the second main ferromagnetic layer are constituted by a plurality of layers, i.e., two or more layers. However, in the example depicted in FIG. 4, each of the first main ferromagnetic layer and the second main ferromagnetic layer consists of the two magnetic layers. Referring to FIG. 4, the laminated ferrimagnetic thin film according to the second embodiment will now be described.

As shown in FIG. 4, in the laminated ferrimagnetic thin film according to this embodiment, a buffer layer 601 is formed on a substrate 600, and on this buffer layer 601 are superimposed a first ferromagnetic layer 602, a second ferromagnetic layer 603, a first interface ferromagnetic layer 604, a non-magnetic intermediate layer 605, a second interface ferromagnetic layer 606, a third ferromagnetic layer 607, a fourth ferromagnetic layer 608 and a cap layer 609 in the mentioned order.

The non-magnetic intermediate layer 605 is formed of any non-magnetic transition metal of Ru, Rh, Ir and Cu, or an alloy having as a main component this non-magnetic transition metal.

A material of each of the first interface ferromagnetic layer 604 and the second interface ferromagnetic layer 606 is Co or an alloy including Co. As an alloy including Co, materials such as Co—Fe, Co—Cr, Co—Cu, Co—Pt, Co—Mn and the like are preferable. Above all, a Co—Fe alloy is most preferable. Further, if its composition is $Co_XFe_{1-X}$ ($0.75 \leq X < 1$) and a Co composition X is not less than 75 atom %, it becomes more preferable.

A film thickness of each of the first interface ferromagnetic layer 604 and the second interface ferromagnetic layer 606 is at least not less than 0.1 nm.

It is determined that a material of at least one of the first ferromagnetic layer 602 and the second ferromagnetic layer 603 is Ni or an alloy including Ni. Furthermore, it is determined that a material of at least one of the third ferromagnetic layer 607 and the fourth ferromagnetic layer 604 is Ni or an alloy including Ni. As Ni or an alloy including Ni, a soft magnetic-film including Ni as a component is preferable. Specifically, as a soft magnetic film including Ni as a component, there are Ni—Fe, Ni—Fe—Mo, Ni—Fe—Nb, Ni—Fe—B, Ni—Fe—Cr—Cu, Ni—Fe—Co, Ni—Co, Ni—Fe—Co and the like. Above all, an Ni—Fe alloy is particularly superior in the soft magnetism and most preferable. Furthermore, if it is a perm alloy ($Ni_XFe_{1-X}$ ($0.35 \leq X < 1$)) and an Ni composition X is not less than 35 atom %, the coercive force can be reduced to 79 A/m (1 (Oe)) or below.

A total film thickness of layers formed of Ni or an alloy including Ni in the first ferromagnetic layer 602 and the second ferromagnetic layer 603 is determined to be not less than 60% of a film thickness of the first ferromagnetic layer 612. Moreover, a total film thickness of layers formed of Ni or an alloy including Ni in the third ferromagnetic layer 607 and the fourth ferromagnetic layer 608 is determined to be not less than 60% of a film thickness of the second ferromagnetic layer 613.

The buffer layer 601 can be formed of Ta, Zr, Ti and the like. However, the buffer layer 601 can be formed by using any other material as long as it can improve the contact between the first ferromagnetic layer 602 and the substrate 600. In addition, the buffer layer 601 may not be formed in some cases.

The cap layer 609 can be formed of Ta, Zr, Ti, Al and others. However, any other material can be used for the cap layer 609 as long as it can prevent the surface of the fourth ferromagnetic layer 608 from being deteriorated due to exposure to air, and the cap layer 609 may not be formed in some cases.

The first ferromagnetic layer 602 and the second ferromagnetic layer 603 constitute the first main ferromagnetic layer 610, and the third ferromagnetic layer 607 and the fourth ferromagnetic layer 608 constitute the second main ferromagnetic layer 611. In addition, the first main ferromagnetic layer 610 and the first interface ferromagnetic layer 604 constitute the first ferromagnetic layer 612, and the second main ferromagnetic layer 611 and the second interface ferromagnetic layer 606 constitute the second ferromagnetic layer 613. The first ferromagnetic layer 612 and the second ferromagnetic layer 613 are magnetically coupled in such a manner that directions of their magnetic moments become anti-parallel to each other by the anti-ferromagnetic exchange bonding effect through the non-magnetic intermediate layer 605.

Although the above has described an example of the second embodiment when each of the first main ferromagnetic layer and the second main ferromagnetic layer consists of two magnetic layers, one of the first main ferromagnetic layer and the second main ferromagnetic layer may have the same one-layer structure as the first embodiment. Further, if at least one layer in the first main ferromagnetic layer is formed of Ni or an alloy including Ni and a total film thickness of layers formed of Ni or an alloy including Ni in the first main ferromagnetic layer is not less than 60% of a film thickness of the first ferromagnetic layer, the first main ferromagnetic layer may have a structure constituted by three or more magnetic layers. Likewise, if at least one layer in the second main ferromagnetic layer is formed of Ni or an alloy including Ni and a total film thickness of layers formed of Ni or an alloy including Ni in the second main ferromagnetic layer is not less than 60% of a film thickness of the second ferromagnetic layer, the second main ferromagnetic layer may have a structure constituted by three or more magnetic layers. Furthermore, the upper limit of the number of layers in the first main ferromagnetic layer or the second ferromagnetic layer is not particularly restricted, and a layer having a component concentration of its material being inclined in a layer thickness direction may be included.

It is to be noted that a material of layers other than layers formed of Ni or an alloy including Ni in the first main ferromagnetic layer or the second main ferromagnetic layer is not particularly limited as long as it is a magnetic material. It is, however, desirable that this layer is formed of a material having any other effect.

Third Embodiment

Description will now be given as to a structure and a manufacturing method of a magneto-resistive effect element according to a third embodiment of the present invention. The magneto-resistive effect element according to this embodiment is a magneto-resistive effect element in which the laminated ferrimagnetic thin film is used as a free magnetic layer thereof.

Figure 5:
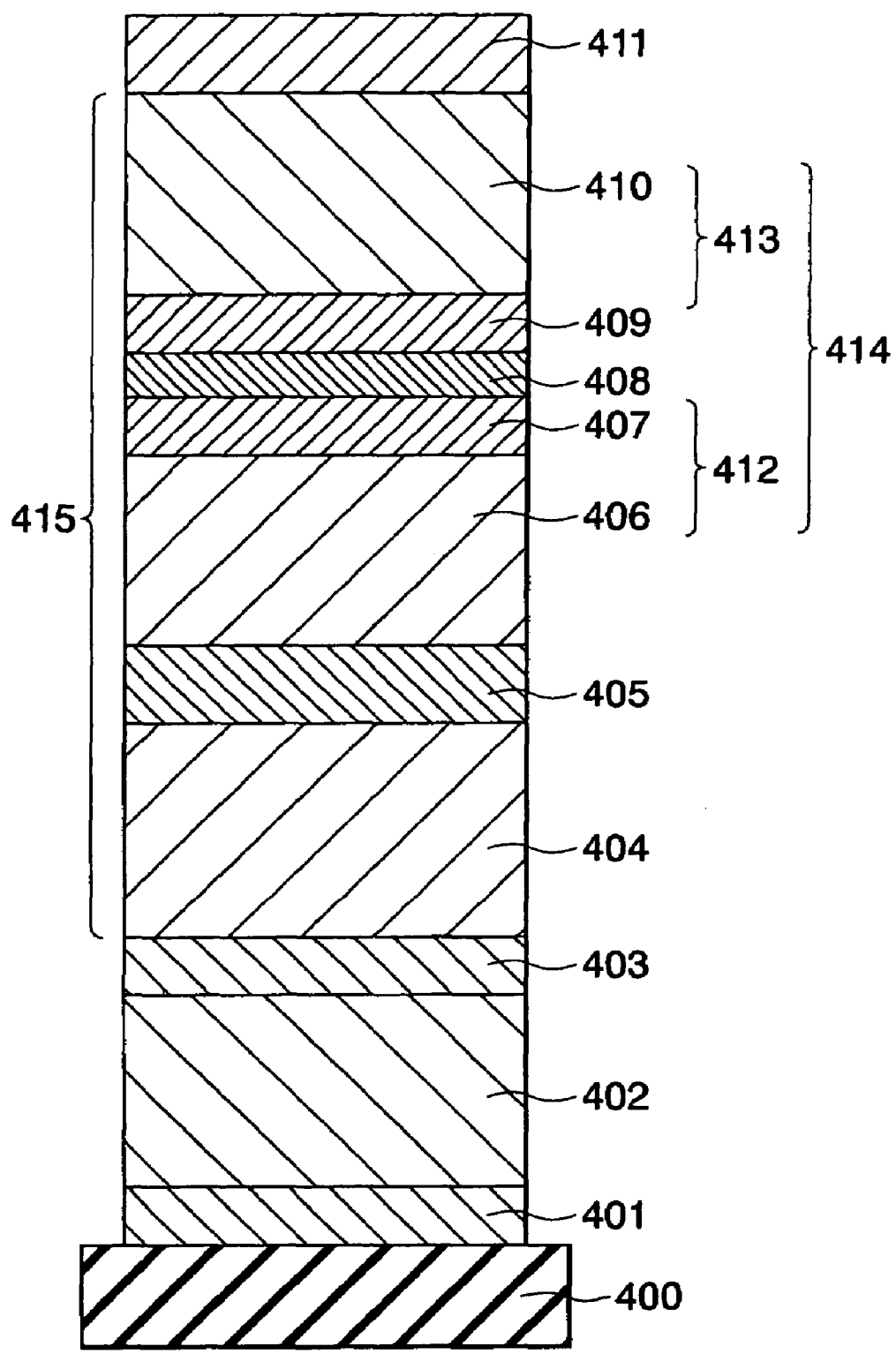
FIG. 5 is a cross-sectional view showing a basic film structure of a magneto-resistive effect element according to a third embodiment.

In the magneto-resistive effect element according to the third embodiment of the present invention, as shown in FIG. 5, a first buffer layer 401 is formed on a substrate 400, an underlying electrode layer 402 is formed on the first buffer layer 401, and on the underlying electrode layer 402 are formed a second buffer layer 403, a pinned magnetic layer 404, a non-magnetic layer 405, a first main ferromagnetic layer 406, a first interface ferromagnetic layer 407, a non-magnetic intermediate layer 408, a second interface ferromagnetic layer 409, a second main ferromagnetic layer 410 and a cap layer 411 in the mentioned order.

It is determined that a material of the non-magnetic intermediate layer 408 is any one of Ru, Rh, Ir and Cu, or a non-magnetic transition metal having any of these materials as a main component.

It is determined that a material of each of the first interface ferromagnetic layer 407 and the second interface ferromagnetic layer 409 is Co or a Co alloy. As a Co alloy, Co—Fe, Co—Cr, Co—Cu, Co—Pt, Co—Mn and the like are preferable. Above all, Co—Fe is most preferable. Furthermore, if its composition is $Co_XFe_{1-X}$ ($0.75 \leq X < 1$) and a Co composition X is not less than 75 atom %, it becomes more preferable.

It is determined that a film thickness of each of the first interface ferromagnetic layer 407 and the second interface ferromagnetic layer 409 is at least 0.1 nm or above.

Each of the first main ferromagnetic layer 406 and the second main ferromagnetic layer 410 can be formed of Ni or an Ni alloy. As an Ni alloy, a soft magnetic film including Ni as a component is preferable. Specifically, as a soft magnetic film including Ni as a component, there are Ni—Fe, Ni—Fe—Mo, Ni—Fe—Nb, Ni—Fe—Nb, Ni—Fe—B, Ni—Fe—Cr—Cu, Ni—Fe—Co, Ni—Co, Ni—Fe—Co and the like. Above all, Ni—Fe is particularly superior in the soft magnetism, and most preferable. Moreover, if it is a perm alloy ($Ni_XFe_{1-X}$ ($0.35 \leq X < 1$) and an Ni composition X is not less than 35 atom %, the coercive force can be reduced to 79 A/m (1 (Oe)) or below.

It is determined that a film thickness of the first main ferromagnetic layer 406 is not less than 60% of a film thickness of the first free magnetic layer 412, and a film thickness of the second main ferromagnetic layer 410 is not less than 60% of a film thickness of the second free magnetic layer 413.

Each of the first buffer layer 401 and the second buffer layer 403 can be formed of Ta, Zr, Ti and the like. However, it is good enough to use a material having a function of, e.g., improving the contact between the underlying electrode layer 402 and the substrate 400 or between the pinned magnetic layer 404 and the underlying electrode layer 402, and these buffer layers 401 and 403 may not be formed in some cases.

Ta, Zr, Ti, Al or the like is used for the cap layer 411. However, any other material can be used if the cap layer is at least one layer having a function of, e.g., preventing the surface of the second main ferromagnetic layer 410 from being deteriorated due to exposure to air, and the cap layer 411 may not be formed in some cases.

The underlying electrode layer 402 can be formed of Al. However, it may be formed by using any other metal material such as Ag, Cu, Au or Pt having a small specific resistance, and the underlying electrode layer 402 may be formed by using any other material or may not be formed in some cases.

As a material of the pinned magnetic layer 404, Co, CoFe or the like is preferable. However, any other material can be used as long as it has a magnetic characteristic which hardly causes reversion with respect to an external magnetic field. Moreover, the pinned magnetic layer 404 can be constituted by a plurality of layers. In particular, a laminated ferri type three-layer structure or a two-layer structure including the ferromagnetic layer/antiferromagnetic layer is more preferable since it can positively fix its magnetization direction.

A non-magnetic good conductor such as Cu, Au or Ag, or a non-magnetic insulator such as an Al oxide, a Ta oxide or an Al nitride is used for the non-magnetic layer 405. An element which is of a type using a non-magnetic good conductor such as Cu, Au, Ag or the like is called a spin valve type GMR element, and an element which is of a type using a non-magnetic insulator such as an Al oxide, a Ta oxide or an Al nitride is called a ferromagnetic tunnel junction element. In case of the ferromagnetic tunnel junction element, it is possible to employ a method by which a film of a nonmagnetic metal layer formed of, e.g., Al is formed and its surface is then oxidized or azotized by using a gas including oxygen or nitrogen, thereby forming the non-magnetic layer 405 as an insulator.

Description will now be given as to an operation of the magnetoresistive effect element having the above-described structure. The first main ferromagnetic layer 406 and the first interface ferromagnetic layer 407 constitute the first free magnetic layer 412, and the second main ferromagnetic layer 410 and the second interface ferromagnetic layer 408 constitute the second free magnetic layer 413. The first free magnetic layer 412 and the second free magnetic layer 413 are magnetically coupled in such a manner that directions of their magnetic moments become anti-parallel to each other by the anti-ferromagnetic exchange bonding effect through the non-magnetic intermediate layer 408, and function as a free magnetic layers. The first free magnetic layer 412, the non-magnetic intermediate layer 408 and the second free magnetic layer 413 constitute the free magnetic layer 414. In addition, the pinned magnetic layer 404, the non-magnetic layer 405 and the free magnetic layer 414 constitute a magneto-resistive effect portion 415 which varies the resistance due to a change in an external magnetic field and demonstrates the magneto-resistive effect.

In recent years, there have been demanded high integration and miniaturization even in the magneto-resistive effect element because of a request of high integration of a thin film device. In this case, a film thickness of each layer must be reduced in order to decrease a planar shape. However, when reducing the film thickness, there is a problem of mixing on the atomic level between layers adjacent to each other in the vertical direction, there is a limit in reduction in thickness of each layer. In the magneto-resistive effect element according to this embodiment, however, since the free magnetic layer 414 has a structure that the first free magnetic layer 412 and the second free magnetic layer 413 are superimposed with the non-magnetic intermediate layer 408 sandwiched therebetween, the magnetic moments that the first free magnetic layer 412 and the second free magnetic layer 413 face the opposite directions are formed, thereby canceling out the magnetic fields. Therefore, the actual film thicknesses are large, but the magnetic film thicknesses are very small. That is, even though the actual film thickness is not reduced, the free magnetic layer serves as a magnetically thin free magnetic layer. Therefore, the magneto-resistive effect element according to this embodiment is advantageous in high integration.

Description will now be given as to a method of manufacturing a magneto-resistive effect element according to a third embodiment. First, films of the first buffer layer 401, the underlying electrode layer 402, and the second buffer layer 403 are formed on the substrate 400. If irregularities on the upper part of the underlying electrode layer 402 are prominent, it is good to perform a surface flattening treatment such as ion beam irradiation on the film surface. Then, films of the pinned magnetic layer 404 and the non-magnetic layer 405 are formed. Further, films of the first main ferromagnetic layer 406, the first interface ferromagnetic layer 407, the non-magnetic intermediate layer 408, the second interface ferromagnetic layer 409, the second main ferromagnetic layer 410 and the cap layer 411 are formed thereon, thereby bringing a multi-layer thin film structure of the magnetoresistive effect element according to the third embodiment to completion.

It is to be noted that the advantage of the present invention does not correlate with an absolution positional relationship (film forming order) between the pinned magnetic layer 404 and the free magnetic layer 414. As to the magneto-resistive effect portion 415, an entirely inverted structure (entirely inverted film forming order) may be adopted.

The manufacturing process is effected with respect to the obtained multi-layer thin film as described below, thereby bringing the magnetoresistive effect element according to the third embodiment to completion.

First, an optical exposure or electron ray exposure technique is used, a resist which defines the underlying electrode shape is produced on the obtained multi-layer thin film. Then, an ion milling or chemical etching technique is used, and all the layers in the obtained multi-layer thin film are processed into an object underlying electrode shape. It is to be noted that, if the magneto-resistive effect element is a spin valve type GMR element, the underlying electrode layer 402 is not particularly necessary, and the underlying electrode shape processing step is not particularly required either.

Then, the optical exposure or electron ray exposure technique is used, a resist which defines an element shape and an element size is manufactured. Then, the ion milling or chemical etching technique is used, the magnetoresistive effect portion 415 and the cap layer 411 in the multi-layer film which has processed into the underlying electrode shape are processed into an object element shape and element size.

Then, after performing coating using an insulating layer between electrodes, an upper electrode is formed, thereby bringing the magnetoresistive effect element according to the third embodiment to completion.

Fourth Embodiment

A structure and a manufacturing method of a magneto-resistive effect element according to the fourth embodiment of the present invention will now be described with reference to the accompanying drawings. The magnetoresistive effect element according to this embodiment uses a laminated ferrimagnetic thin film as its free magnetic layer. Although the magnetoresistive effect element according to the fourth embodiment is basically the same as the magnetoresistive effect element according to the third embodiment, either or both of the first main ferromagnetic layer and the second main ferromagnetic layer are constituted by a plurality of, i.e., two or more layers with respect to the magneto-resistive effect element according to the third embodiment.

Figure 6:
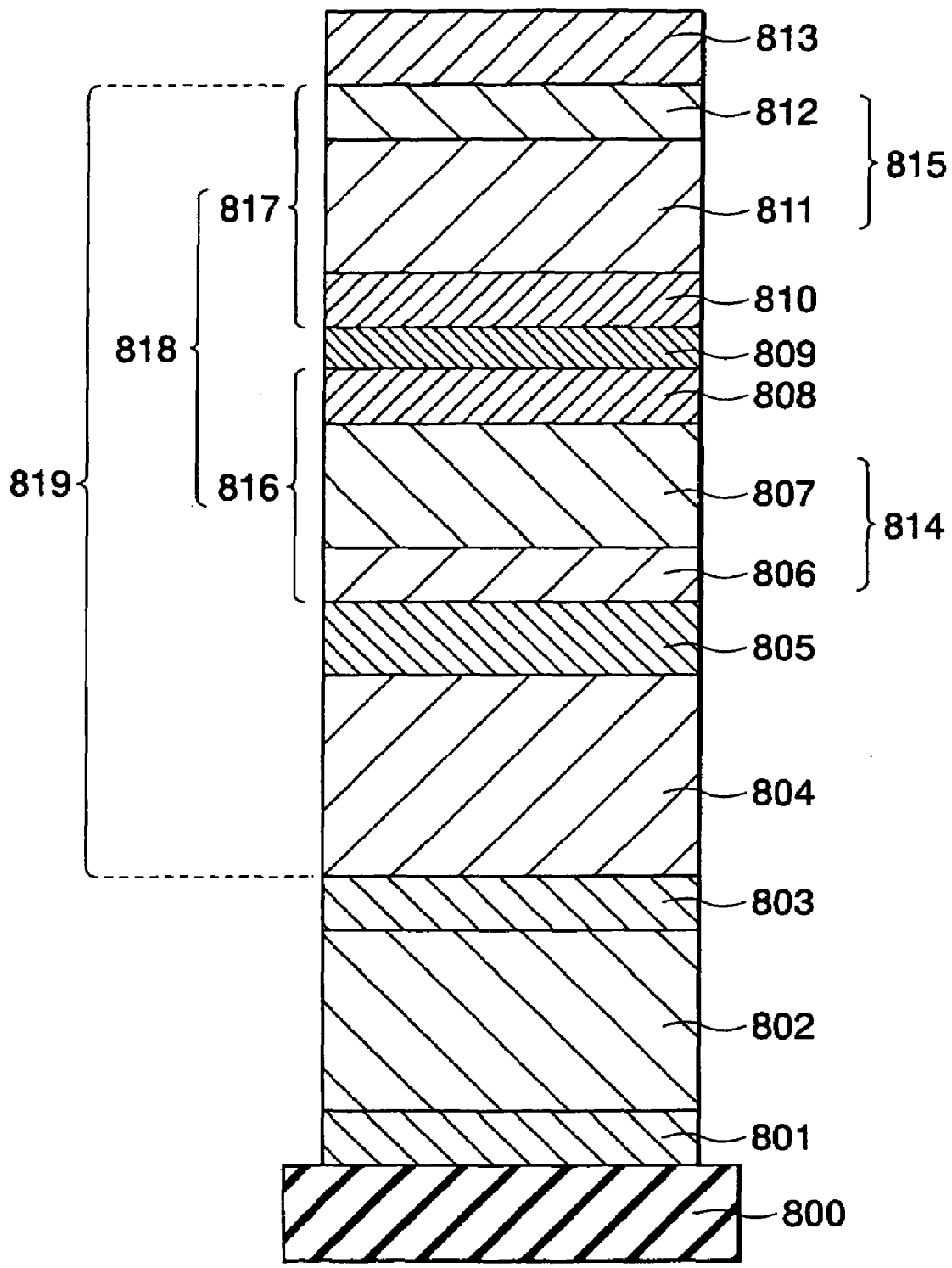
FIG. 6 is a cross-sectional view showing a basic film structure of a magneto-resistive effect element according to a fourth embodiment.

FIG. 6 is a cross-sectional view showing an element in which each of the first main ferromagnetic layer and the second main ferromagnetic layer is constituted by two magnetic layers as an example of the fourth embodiment according to the present invention. As shown in FIG. 6, in the magnetoresistive effect element according to this embodiment, on a substrate 800 are formed a first buffer layer 801, an underlying electrode layer 802, a second buffer layer 803, a pinned magnetic layer 804, a non-magnetic layer 805, a first ferromagnetic layer 806, a second ferromagnetic layer 807, a first interface ferromagnetic layer 808, a non-magnetic intermediate layer 809, a second interface ferromagnetic layer 810, a third ferromagnetic layer 811, a fourth ferromagnetic layer 812 and a cap layer 813 in the mentioned order.

The non-magnetic intermediate layer 809 is formed of any non-magnetic transition metal selected from Ru, Rh, Ir and Cu, or of an alloy including this non-magnetic transition metal as a main component.

A material of each of the first interface ferromagnetic layer 808 and the second interface ferromagnetic layer 810 is Co or an alloy including Co. As an alloy including Co, Co—Fe, Co—Cr, Co—Cu, Co—Pt, Co—Mn and the like are preferable. Above all, Co—Fe is most preferable. Further, if its composition is $Co_XFe_{1-X}$ ($0.75 \leq X < 1$) and a Co composition X is not less than 75 atom %, it becomes further preferable.

A film thickness of each of the first interface ferromagnetic layer 808 and the second interface ferromagnetic layer 810 is determined to be at least 0.1 nm or above.

It is determined that a material of at least one of the first ferromagnetic layer 806 and the second ferromagnetic layer 807 is Ni or an alloy including Ni. Furthermore, it is determined that a material of at least one of the third ferromagnetic layer 811 and the fourth ferromagnetic layer 812 is Ni or an Ni alloy. As Ni or the Ni alloy, a soft magnetic film including Ni as a component is preferable. Specifically, as a soft magnetic layer including Ni as a component, there are Ni—Fe, Ni—Fe—Mo, Ni—Fe—Nb, Ni—Fe—B, Ni—Fe—Cr—Cu, Ni—Fe—Co, Ni—Co, Ni—Fe—Co and the like. Above all, Ni—Fe is particularly superior in the soft magnetism and most preferable. Moreover, if it is a perm alloy ($Ni_XFe_{1-X}$ ($0.35 \leq X < 1$)) and an Ni composition X is not less than 35 atom %, the coercive force can be reduced to 79 A/m (1 (Oe)) or below.

It is determined that a total film thickness of layers consisting of Ni or an alloy including Ni in the first ferromagnetic layer 806 and the second ferromagnetic layer 807 is not less than 60% of a film thickness of the first free magnetic layer 816. In addition, it is determined that a total film thickness of layers consisting of Ni or an alloy including Ni in the third ferromagnetic layer 811 and the fourth ferromagnetic layer 812 is not less than 60% of a film thickness of the second free magnetic layer 817.

The first buffer layer 801 and the second buffer layer 803 can be formed of Ta, Zr, Ti and the like. However, any other material can be used as long as it has a function of, e.g., increasing the contact between the underlying electrode layer 802 and the substrate 800 or between the pinned magnetic layer 804 and the underlying electrode layer 802, and these buffer layers may not be formed in some cases.

The cap layer 813 can be formed of Ta, Zr, Ti, Al and the like. However, any other material can be used as long as it has a function of, e.g., preventing the surface of the fourth ferromagnetic layer 812 from being deteriorated due to exposure to air, and the cap layer 813 may not be formed in some cases.

The underlying electrode layer 802 can be formed of Al. However, any other metal material having a small specific resistance such as Ag, Cu, Au, Pt and the like is also preferable. Additionally, any other material can be used or the underlying electrode layer 802 may not be formed in some cases.

As a material of the pinned magnetic layer 804, Co, CoFe or the like is preferable. However, any other material can be used as long as it has a magnetic characteristic which is hardly reverted with respect to an external magnetic field. Further, the pinned magnetic layer 804 can be constituted by a plurality of layers. In particular, a laminated ferri type three-layer structure or a two-layer structure including the ferromagnetic layer/anti-ferromagnetic layer is further preferable since it can positively fix its magnetization direction.

The non-magnetic layer 805 can be formed of a non-magnetic good conductor such as Cu, Au or Ag, or a non-magnetic insulator such as an Al oxide or a Ta oxide or an Al nitride. A type using the non-conductive good conductor such as Cu, Au or Ag is called a spin valve type GMR element, and a type using the non-magnetic insulator such as an Al oxide, a Ta oxide or an Al nitride is called a ferromagnetic tunnel junction element. In case of the ferromagnetic tunnel junction element, after forming a film of a non-magnetic metal layer formed of, e.g., Al, its surface is oxidized or azotized by using a gap including oxygen or nitrogen, thereby forming the insulative non-conductive layer 805.

The first ferromagnetic layer 806 and the second ferromagnetic layer 807 constitute the first main ferromagnetic layer 814, and the third ferromagnetic layer 811 and the fourth ferromagnetic layer 812 constitute the second main ferromagnetic layer 815. Further, the first main ferromagnetic layer 814 and the first interface ferromagnetic layer 808 constitute the first free magnetic layer 816, and the second main ferromagnetic layer 815 and the second interface ferromagnetic layer 810 constitute the second free magnetic layer 817. The first free magnetic layer 816 and the second free magnetic layer 817 are magnetically coupled in such a manner that directions of their magnetic moments become anti-parallel to each other by the antiferromagnetic exchange bonding effect through the non-magnetic intermediate layer 809, and they function as a free magnetic layer. The first free magnetic layer 816, the non-magnetic intermediate layer 809 and the second free magnetic layer 817 constitute the free magnetic layer 818. The pinned magnetic layer 804, the non-magnetic layer 805 and the free magnetic layer 818 constitute the magneto-resistive effect portion 819 which varies the resistance due to a change in an external magnetic field and demonstrates the magneto-resistive effect.

Description will now be given as to a method of manufacturing a magneto-resistive effect element according to a fourth embodiment. First, films of the first buffer layer 801, the underlying electrode layer 802, and the second buffer layer 803 are formed on the substrate 800. If irregularities on the upper part of the underlying electrode layer 802 are prominent, it is good to perform a surface flattening treatment such as ion beam irradiation on the film surface in this step. Subsequently, films of the pinned magnetic layer 804 and the non-magnetic layer 805 are formed. Furthermore, on the non-magnetic layer 805 are formed the first ferromagnetic layer 806, the second ferromagnetic layer 807, the first interface ferromagnetic layer 808, the non-magnetic intermediate layer 809, the second interface ferromagnetic layer 810, the third ferromagnetic layer 811, the fourth ferromagnetic layer 812 and the cap layer 813. As a result, a multi-layer thin film structure of the magnetoresistive effect element according to the fourth embodiment is obtained.

It is to be noted that the advantage of the present invention does not correlate with an absolute positional relationship (film forming order) of the pinned magnetic layer 804 and the free magnetic layer 818. As to the magneto-resistive effect portion 819, the entirely inverted structure (entirely inverted film forming order) may be adopted.

When the obtained multi-layer thin film is processed by the processing method described below, the magneto-resistive effect element according to the fourth embodiment of the present invention can be obtained.

First, a resist which defines an underlying electrode shape is produced on the obtained multi-layer thin film by the optical exposure or electron ray exposure technique, and all the layers in the obtained multi-layer thin film are processed into the object underlying electrode shape by using the ion milling or chemical etching technique. It is to be noted that, when the magneto-resistive effect element is a spin valve type GMR element, the underlying electrode layer 802 is not necessary particularly, and this underlying electrode shape processing step is not particularly required either.

Subsequently, a resist which defines an element shape and an element size is produced by using the optical exposure or electron ray exposure technique, and the magneto-resistive effect portion 819 and the cap layer 813 in the multi-layer film processed into the underlying electrode shape are processed into the object element shape and element size by using the ion milling or chemical etching technique.

Then, after conducting coating using the inter-electrode insulating layer, the upper electrode is formed, thereby bringing the magneto-resistive effect element according to the fourth embodiment to completion.

Although the above has described the example that each of the first main ferromagnetic layer and the second main ferromagnetic layer consists of two magnetic layers, one of the first main ferromagnetic layer and the second main ferromagnetic layer may have a one-layer structure like the third embodiment. Moreover, if at least one layer in the first main ferromagnetic layer is constituted by Ni or an Ni alloy and a total film thickness of layers consisting of Ni or an Ni alloy in the first main ferromagnetic layer is not less than 60% of a film thickness of the first ferromagnetic layer, it is possible to adopt a structure that the first main ferromagnetic layer consists of three or more magnetic layers. Likewise, if at least one layer in the second main ferromagnetic layer consists of Ni or an Ni alloy and a total film thickness of layers consisting of Ni or an Ni alloy in the second main ferromagnetic layer is not less than 60% of a film thickness of the second ferromagnetic layer, it is possible to employ a structure that the second main ferromagnetic layer consists of three or more magnetic layers.

It is to be noted that a material of layers other that those consisting of Ni or an Ni alloy in the first main ferromagnetic layer or the second main ferromagnetic layer is not particularly restricted as long as it is a magnetic material, but a layer having any other advantage is further preferable.

Description will now be given as to a result of manufacturing a laminated ferrimagnetic thin film according to the embodiments of the present invention and evaluating its magnetic characteristic.

FIRST EXAMPLE

Figure 7:
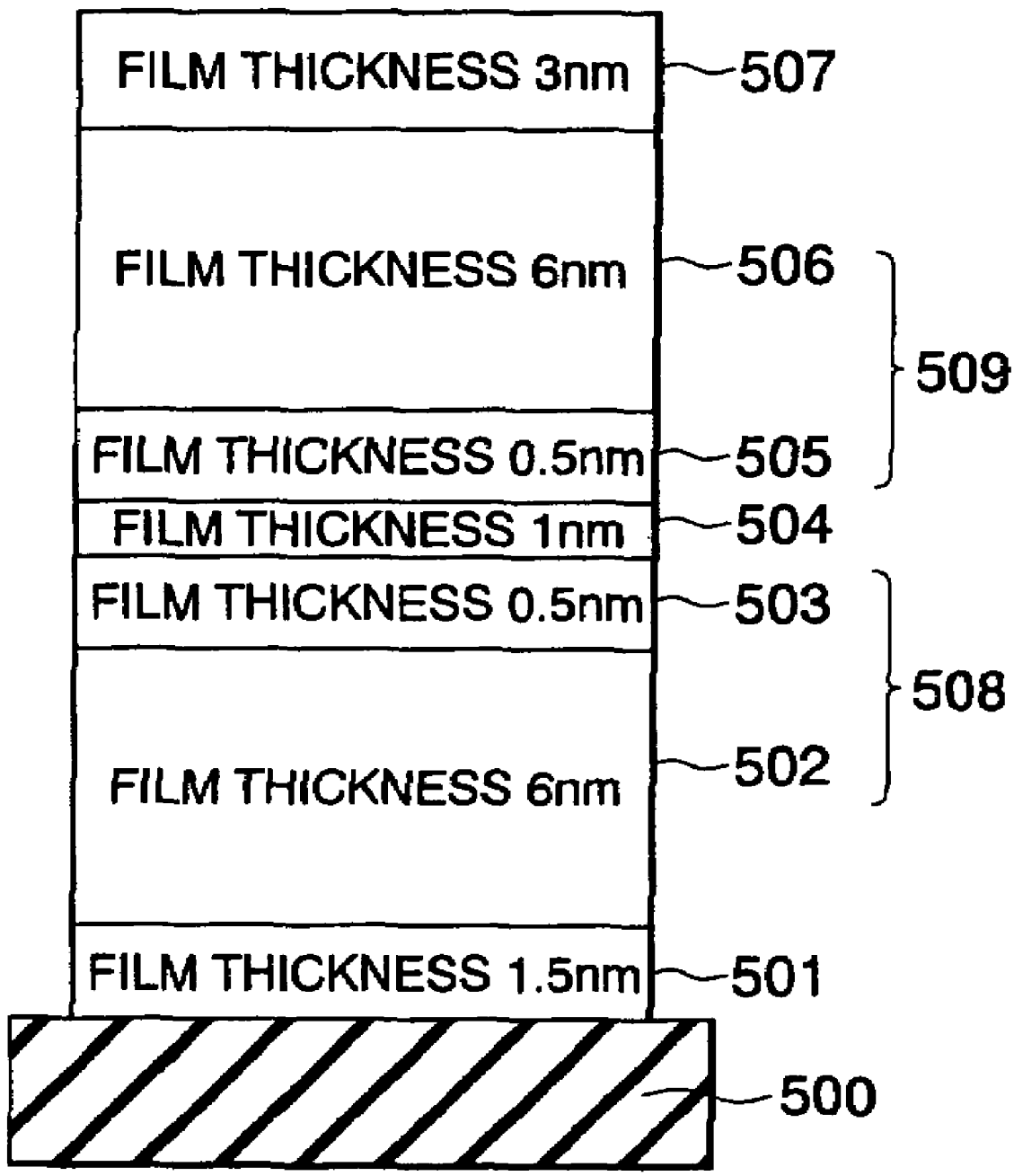
FIG. 7 is a cross-sectional view showing a basic film structure of the laminated ferrimagnetic thin film according to the first example.

As shown in FIG. 7, a laminated ferrimagnetic thin film according to the first example has a superimposed structure of a thermally oxidized silicon substrate 500/a first Ta layer 501/a first NiFe layer 502/a first CoFe layer 503/an Ru layer 504/a second CoFe layer 505/a second NiFe layer 506/a second Ta layer 507. Compositions of the NiFe layer and the CoFe layer are $Ni_{0.8}Fe_{0.2}$ (Ni composition: 80 atom %) and $Co_{0.9}Fe_{0.1}$ (Co composition: 90 atom %), respectively. As shown in the drawing, the first Ta layer 501 has a film thickness of 1.5 nm; the first NiFe layer 502, 6 nm; the first CoFe layer 503, 0.5 nm; the Ru layer 504, 1 nm; the second CoFe layer 505, 0.5 nm; the second NiFe layer 506, 6 nm; and the second Ta layer 507, 3 nm. In the first embodiment, the thermally oxidized silicon substrate 500 is used as the substrate 300; the Ta layers 501 and 507, as the buffer layer 301 and the cap layer 307; the NiFe layers 502 and 506, as the first main ferromagnetic layer 302 and the second main ferromagnetic layer 306; the CoFe layers 503 and 505, as the first interface ferromagnetic layer 303 and the second interface ferromagnetic layer 305, and the Ru layer 504 as the non-magnetic intermediate layer 304, respectively.

The first NiFe layer 502 and the first CoFe layer 503 constitute the first ferromagnetic layer 508, and the second NiFe layer 506 and the second CoFe layer 505 constitute the second ferromagnetic layer 509. The first ferromagnetic layer 508 and the second ferromagnetic layer 509 are magnetically coupled in such a manner that directions of their magnetic moments become anti-parallel to each other by the anti-ferromagnetic exchange bonding effect through the Ru layer 504. The laminated ferrimagnetic thin film according to the first embodiment is of a type that the respective film thicknesses (magnetic moments) of the first ferromagnetic layer 508 and the second ferromagnetic layer 509 are equal to each other, and this is a structure most suitable for evaluating the magnitude of the antiferromagnetic exchange bonding acting between the first ferromagnetic layer 508 and the second ferromagnetic layer 509.

The manufacturing method will now be described. First, a film of the first Ta layer 501 having a thickness of 1.5 nm was formed on the thermally oxidized silicon substrate 500. Then, films of the first NiFe layer 502 having a thickness of 6 nm, the first CoFe layer 503 having a thickness of 0.5 nm, the Ru layer 504 having a thickness of 1 nm, the second CoFe layer 505 having a thickness of 0.5 nm, and the second NiFe layer 506 having a thickness of 6 nm were formed. Furthermore, a film of the second Ta layer 507 having a thickness of 3 nm was formed, thereby bringing the laminated ferrimagnetic thin film according to the first embodiment of the present invention to completion.

The thin film forming apparatus used is a DC magnetron sputter apparatus including eight sputter targets each having a diameter of two inches. A degree of vacuum in a film forming chamber was $5 \times 10^{-9}$ Torr and an argon gas pressure during sputtering was 3 mTorr.

The thus manufactured laminated ferrimagnetic thin film was cut into a dimension of 1 cm×1 cm, and its magnetic characteristic was evaluated by using a vibration sample type magnetometer.

Figure 8:
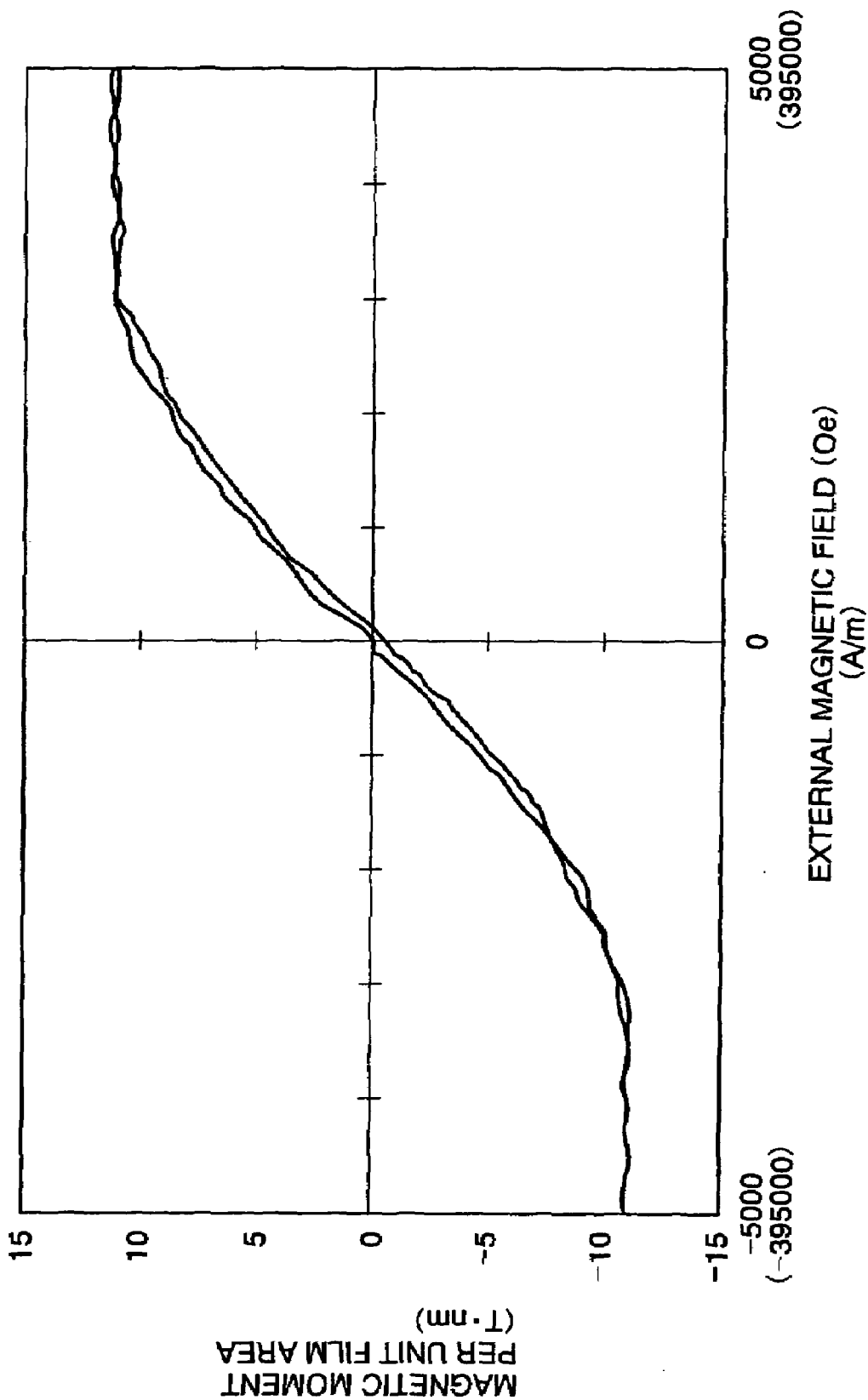
FIG. 8 is a view showing a relationship between an external magnetic field and a magnetic moment per unit film area in the laminated ferrimagnetic thin film according to the first example.

FIG. 8 shows magnetization curves of the laminated ferrimagnetic thin film according to the first example. This drawing illustrates a change in magnetic moment (vertical axis) per unit film area with respect to a change in external magnetic field (horizontal axis). As to the external magnetic field, reciprocating scanning was carried out in a range of −395000 A/m (−5000 (Oe)) to 395000 A/m (5000 (Oe)).

From FIG. 8, the effect of reducing the magnetic film thickness in the low magnetic field can be confirmed in the laminated ferrimagnetic thin film according to the present invention. In FIG. 8, when the external magnetic field is zero, the magnetic moment per unit film area is 0 T·nm. This indicates a state that directions of the magnetic moments of the first ferromagnetic layer 508 and the second ferromagnetic layer 509 become anti-parallel to each other by the anti-ferromagnetic exchange bonding acting between these layers, and the magnetic moments of the first ferromagnetic layer 508 and the second ferromagnetic layer 509 are equal to each other in this embodiment, which cancels out the magnitudes of the magnetic moments.

Moreover, when the external magnetic field is not less than 244900 A/m (3100 (Oe)) (=saturation magnetic field ($H_S$)), the magnetic moment per unit film area has a fixed value. This indicates a state that a large external magnetic field which surpasses the anti-ferromagnetic exchange bonding acting between the first ferromagnetic layer 508 and the second ferromagnetic layer 509 is applied, and orientations of the first ferromagnetic layer 508 and the second ferromagnetic layer 509 are aligned in the completely the same direction (magnetic field applying direction) (magnetic saturation state). Since the magnetic moment per unit film area in the magnetic saturation state is 11.4 T·nm, it can be understood that the saturation magnetic moment (M) per unit film area of each of the first ferromagnetic layer 508 and the second ferromagnetic layer 509 is 5.7 T·nm.

In the relational expression ($J=H_S \times M_S \times t/2$) between the antiferromagnetic exchange bonding energy (J) and the saturation magnetic field ($H_S$) when the film thicknesses of the respective ferromagnetic layers are equal to each other, $M_S \times t$ is indicative of a saturation magnetic moment per unit film area of each ferromagnetic layer. Therefore, the anti-ferromagnetic exchange bonding energy (J) of the laminated ferrimagnetic thin film according to this embodiment can be calculated based on $J=H_S \times M/2$ by using the saturation magnetic field ($H_S$) and the saturation magnetic moment (M) per unit film area.

The anti-ferromagnetic exchange bonding energy between the ferromagnetic layers in the laminated ferrimagnetic thin film according to the first embodiment obtained based on this relational expression was $7 \times 10^{-4}$ J/m² (0.7 erg/cm²).

It is to be noted that the same advantage was obtained in the laminated ferrimagnetic thin film using Co, Co—Pt and Co—Cr as materials of the first interface ferromagnetic layer and the second interface ferromagnetic layer. However, its anti-ferromagnetic exchange bonding energy was $5 \times 10^{-4}$ to $6 \times 10^{-4}$ J/m² (0.5 to 0.6 erg/cm²) when an Ru film thickness is 1 nm, which was slightly smaller than that when CoFe was used.

In addition, in the laminated ferrimagnetic thin film using CoFe as a material of the first interface ferromagnetic layer and the second interface ferromagnetic layer, the large anti-ferromagnetic exchange bonding energy of $4 \times 10^{-4}$ to $7 \times 10^{-4}$ J/m² (0.4 to 0.7 erg/cm²) was obtained irrespective of the composition of CoFe when the Ru film thickness is 1 nm. However, when the Co composition is not less than 75 atom %, the particularly large antiferromagnetic exchange bonding energy (not less than $6 \times 10^{-4}$ J/m² (0.6 erg/cm²)) was obtained.

FIRST COMPARATIVE EXAMPLE

As a first comparative example of the first embodiment, a conventional laminated ferrimagnetic thin film using CoFe was manufactured and its magnetic characteristic was evaluated.

Figure 9:
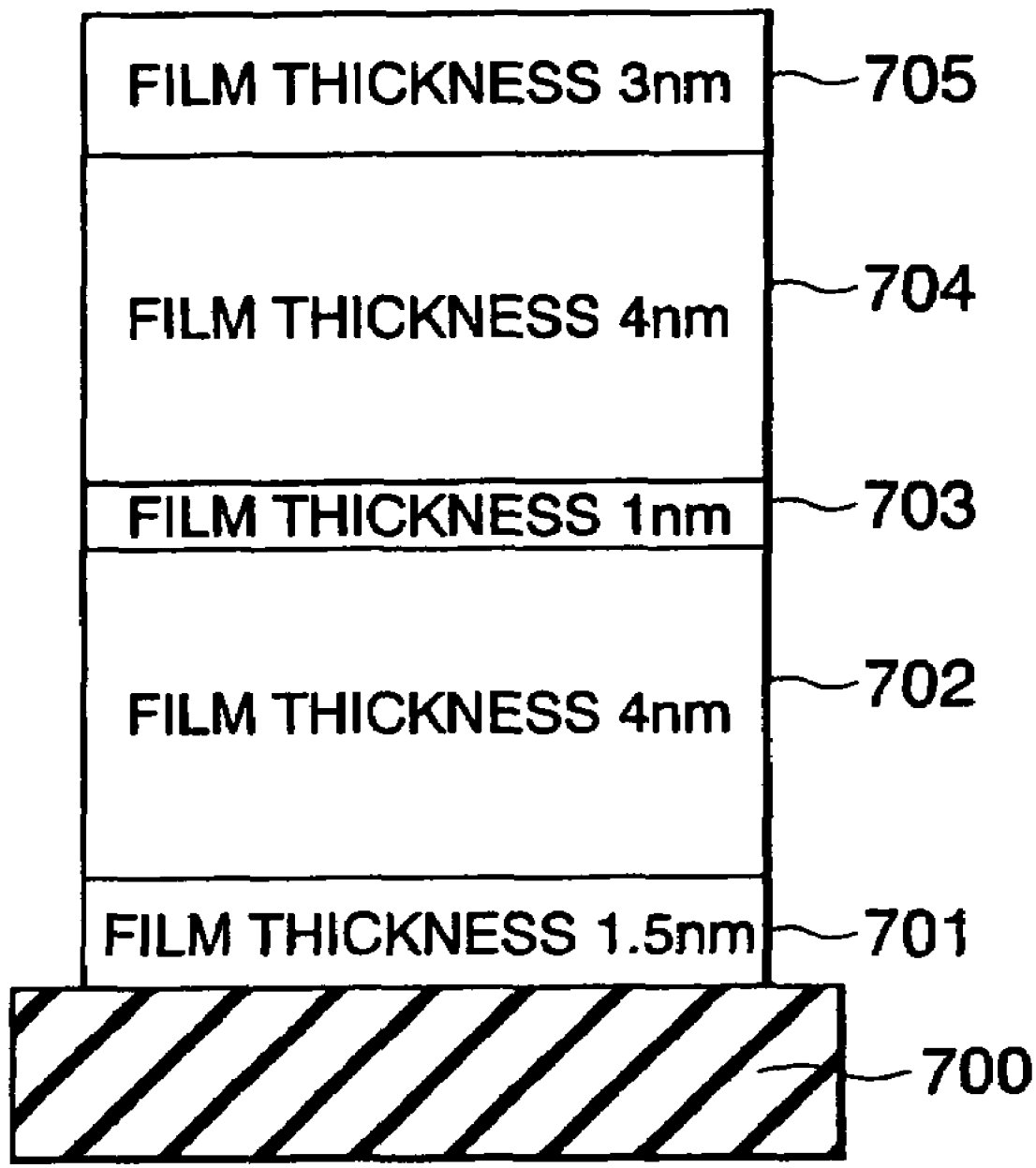
FIG. 9 is a cross-sectional view showing a basic film structure of a laminated ferrimagnetic thin film according to a first comparative example.

As shown in FIG. 9, a laminated ferrimagnetic thin film according to the first comparative example has a laminated structure including a thermally oxidized silicon substrate 700/a first Ta layer 701/a first CoFe layer 702/a Ru layer 703/a second CoFe layer 704/a second Ta layer 705. Compositions of the NiFe layer and the CoFe layer used are $Ni_{0.8}Fe_{0.2}$ (Ni composition: 80 atom %) and $Co_{0.9}Fe_{0.1}$ (Co composition: 90 atom %), respectively. As shown in the drawing, the first Ta layer 701 has a thickness of 1.5 nm; the first CoFe layer 702, 4 nm; the Ru layer 703, 1 nm; the second CoFe layer 704, 4 nm; and the second Ta layer 705, 3 nm. This is the conventional laminated ferrimagnetic thin film in which the thermally oxidized silicon substrate is used as the substrate, Ta is used as the buffer layer and the cap layer, CoFe is used as the ferromagnetic layer and Ru is used as the non-magnetic intermediate layer.

The first CoFe layer 702 and the second CoFe layer 704 are magnetically coupled in such a manner that directions of their magnetic moments become anti-parallel to each other by the anti-ferromagnetic exchange bonding effect through the Ru layer. The laminated ferrimagnetic thin film according to the first comparative example is of a type that film thicknesses (magnetic moments) of the first CoFe layer 702 and the second CoFe layer 704 are equal to each other, and this is the structure most suitable for evaluating the magnitude of the anti-ferromagnetic exchange bonding acting between the first CoFe layer 702 and the second CoFe layer 704.

Description will now be given as to a film forming method of this laminated ferrimagnetic thin film. First, a film of the first Ta layer 701 having a thickness of 1.5 nm was formed on the thermally oxidized silicon substrate 700. Then, a film of the first CoFe layer 702 having a thickness of 4 nm, a film of the Ru layer 703 having a thickness of 1 nm and a film of the second CoFe layer 704 having a thickness of 4 nm were formed. Further, a film of the second Ta layer 705 having a thickness of 3 nm was formed thereon, thereby bringing the laminated ferrimagnetic thin film according to the comparative example 1 to completion.

The thin film forming apparatus used in this example is a DC magnetron sputter apparatus including eight sputter targets each having a diameter of two inches, which is equal to that used in the first embodiment. A degree of vacuum in a film forming chamber was $5 \times 10^{-9}$ Torr, and an argon gas pressure during sputtering was 3 mTorr.

The thus manufactured laminated ferrimagnetic thin film according to the first comparative example was cut out into a dimension of 1 cm×1 cm, and its magnetic characteristic was evaluated by using a vibration sample type magnetometer.

Figure 10:
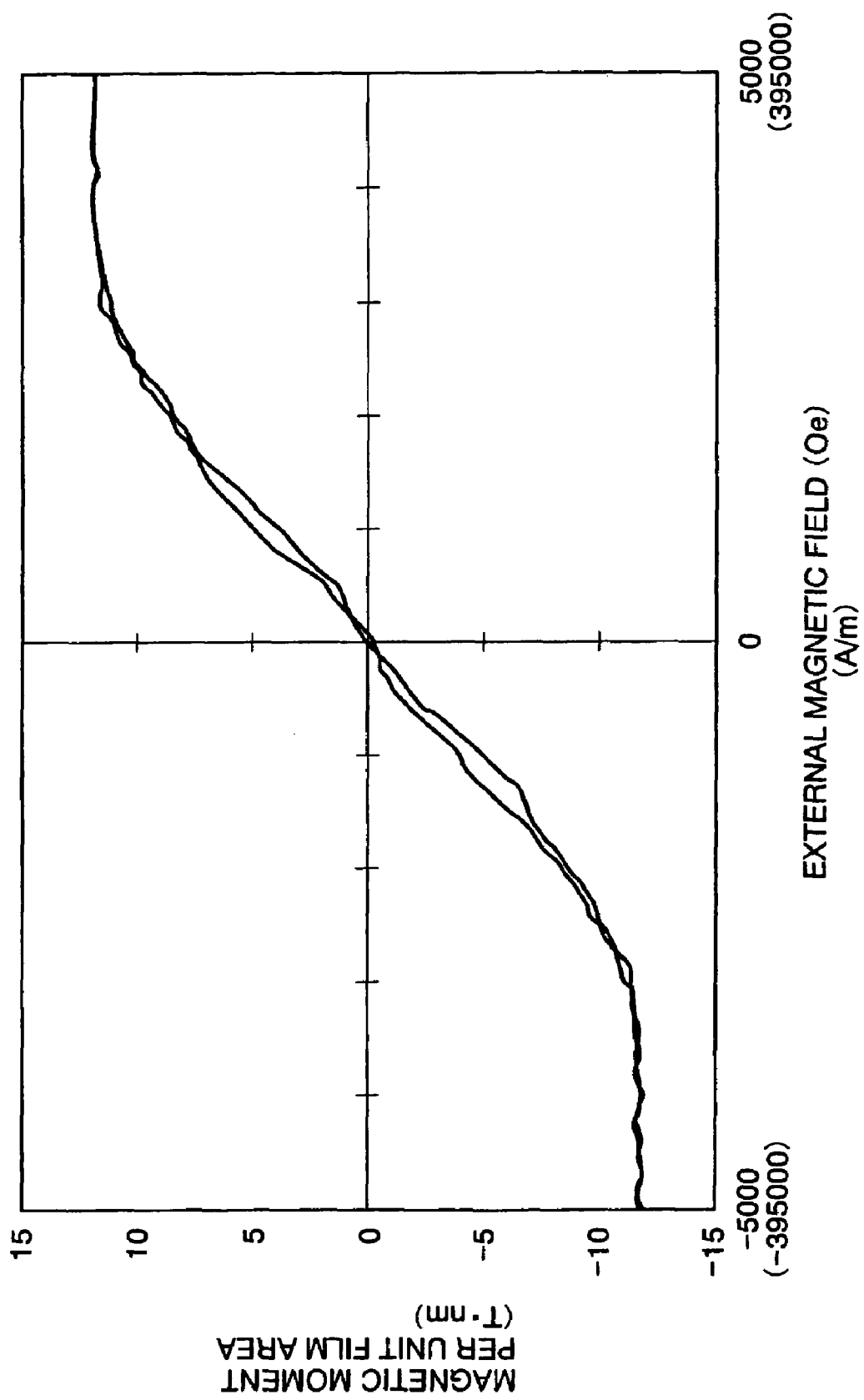
FIG. 10 is a view showing a relationship between an external magnetic field and a magnetic moment per unit film area in the laminated ferrimagnetic thin film according to the first comparative example.

FIG. 10 shows magnetization curves of the laminated ferrimagnetic thin film according to the first comparative example. This drawing illustrates a change in magnetic moment (vertical axis) per unit film area with respect to a change in external magnetic field (horizontal axis). As to the external magnetic field, reciprocating scanning was carried out in a range of −395000 A/m (−5000 (Oe)) to 395000 A/m (5000 (Oe)).

From this drawing, it is possible to confirm the effect of reducing the magnetic film thickness in the low magnetic field of the laminated ferrimagnetic thin film according to the first comparative example. In FIG. 10, when the external magnetic field is zero, the magnetic moment per unit film area is 0 T·nm. This indicates that directions of the magnetic moments of the first CoFe layer 702 and the second CoFe layer 704 become anti-parallel to each other by the anti-ferromagnetic exchange bonding acting between the first CoFe layer 702 and the second CoFe layer 704, and the magnetic moments of the first CoFe layer 702 and the second CoFe layer 704 are equal to each other in the first comparative example, thereby completely canceling out the magnitudes of the magnetic moments.

Furthermore, when the external magnetic field is not less than 244900 A/m (3100 (Oe)) (=saturation magnetic field ($H_S$)), the magnetic moment per unit film area has a fixed value. This corresponds to a state that the large external magnetic field surpassing the anti-ferromagnetic exchange bonding acting between the first CoFe layer 702 and the second CoFe layer is applied and orientations of the first CoFe layer 702 and the second CoFe layer 704 are aligned in completely the same direction (magnetic field application direction) (magnetic saturation state). Since the magnetic moment per unit film area in the magnetic saturation state is 11.4 T·nm, it can be understood that the saturation magnetic moment (M) per unit film area of each of the first CoFe layer 702 and the second CoFe layer 704 is 5.7 T·nm.

Like the first embodiment, the anti-ferromagnetic exchange bonding energy (J) of the laminated ferrimagnetic thin film according to the first comparative example can be calculated based on $J = H_S \times M/2$ by using the saturation magnetic field ($H_S$) and the magnetic moment (M) per unit film area of each ferromagnetic layer during saturation. The anti-ferromagnetic exchange bonding energy between the ferromagnetic layers in the laminated ferrimagnetic thin film according to the first comparative example obtained based on this relational expression was $7 \times 10^{-4}$ J/m² (0.7 erg/cm²).

The characteristic of the laminated ferrimagnetic thin film according to the first embodiment is compared with that according to the first comparative example. The both magnetic films have completely the same antiferromagnetic exchange bonding energy ($7 \times 10^{-4}$ J/m² (0.7 erg/cm²)). It can be said that the anti-ferromagnetic exchange bonding intensity of the laminated ferrimagnetic thin film according to the first embodiment is as strong as that of CoFe/Ru/NiFe-based thin film. Referring to FIG. 1, when the Ru film thickness is 1 nm, the anti-ferromagnetic exchange bonding energy of the NiFe/Ru/NiFe-based film is approximately $5 \times 10^{-5}$ J/m² (0.05 erg/cm²), and the bonding intensity ($7 \times 10^{-4}$ J/m² (0.7 erg/cm²)) of the first embodiment cannot be produced. In the laminated ferrimagnetic thin film according to the first embodiment, it can be said that CoFe (the first interface ferromagnetic layer and the second interface ferromagnetic layer) having a thickness of 0.5 nm at the Ru interface is in charge of magnetic bonding. Furthermore, in the laminated ferrimagnetic thin films according to the first embodiment and the first comparative example, the sufficient magnetic bonding is obtained even in the large film thickness that the Ru film thickness is 1 nm. This indicates that the both thin films have the merit of the Co-based magnetic bonding which does not require precise control over the Ru film thickness (which has a large margin with respect to the Ru film thickness).

It is to be noted that Ru was used as a material of the non-magnetic intermediate layer in the first embodiment, but it is needless to say that the same advantages can be obtained even if Rh, Ir or Cu which gives the large anti-ferromagnetic exchange bonding energy equal to that of Ru is used as the non-magnetic intermediate layer material.

SECOND EXAMPLE

In the laminated ferrimagnetic thin film having the structure like that of the first embodiment, a plurality of samples that a film thickness of the interface ferromagnetic layer (CoFe) was changed were manufactured, and the relationship between each film thickness when CoFe was used for the first and second interface ferromagnetic layers and the advantage of the present invention was examined. Compositions of NiFe and CoFe used are $Ni_{0.8}Fe_{0.2}$ (Ni composition: 80 atom %) and $Co_{0.9}Fe_{0.1}$ (Co composition: 90 atom %), respectively.

Like the first embodiment, in the structure of the laminated ferrimagnetic thin film according to the second embodiment, a terminally oxidized silicon substrate is used as the substrate 300 in the first embodiment; Ta, as the buffer layer 301 and the cap layer 307; NiFe, as the first main ferromagnetic layer 302 and the second main ferromagnetic layer 306; CoFe, as the first interface ferromagnetic layer 303 and the second interface ferromagnetic layer 305; and Ru, as the non-magnetic intermediate layer 304. However, film thicknesses of the first main ferromagnetic layer 302 and the second main ferromagnetic layer 306 and film thicknesses of the first interface ferromagnetic layer 303 and the second interface ferromagnetic layer 305 are different from those in the first embodiment.

Film structures of the manufactured samples according to this embodiment are as shown in Table 1. A numeric figure in parentheses denotes a film thickness (nm) of each layer.

TABLE 1

| Sample 1 | Substrate / Ta (1.5 nm) / NiFe (6.8 nm) / CoFe (0.1 nm) / Ru (1 nm) / CoFe (0.1 nm) / NiFe (6.8 nm) / Ta (3 nm) |
| --- | --- |
| Sample 2 | Substrate / Ta (1.5 nm) / NiFe (6.6 nm) / CoFe (0.2 nm) / Ru (1 nm) / CoFe (0.2 nm) / NiFe (6.6 nm) / Ta (3 nm) |
| Sample 3 | Substrate / Ta (1.5 nm) / NiFe (6.4 nm) / CoFe (0.3 nm) / Ru (1 nm) / CoFe (0.3 nm) / NiFe (6.4 nm) / Ta (3 nm) |
| Sample 4 | Substrate / Ta (1.5 nm) / NiFe (6.2 nm) / CoFe (0.4 nm) / Ru (1 nm) / CoFe (0.4 nm) / NiFe (6.2 nm) / Ta (3 nm) |
| Sample 5 | Substrate / Ta (1.5 nm) / NiFe (5.8 nm) / CoFe (0.6 nm) / Ru (1 nm) / CoFe (0.6 nm) / NiFe (5.8 nm) / Ta (3 nm) |
| Sample 6 | Substrate / Ta (1.5 nm) / NiFe (5.6 nm) / CoFe (0.7 nm) / Ru (1 nm) / CoFe (0.7 nm) / NiFe (5.6 nm) / Ta (3 nm) |
| Sample 7 | Substrate / Ta (1.5 nm) / NiFe (5.0 nm) / CoFe (1.0 nm) / Ru (1 nm) / CoFe (1.0 nm) / NiFe (5.0 nm) / Ta (3 nm) |
| Sample 8 | Substrate / Ta (1.5 nm) / NiFe (4.0 nm) / CoFe (1.5 nm) / Ru (1 nm) / CoFe (1.5 nm) / NiFe (4.0 nm) / Ta (3 nm) |

The manufacturing method is also substantially equal to that of the first embodiment. First, films of a Ta layer having a thickness of 1.5 nm, an NiFe layer having an object thickness and a CoFe layer having an object thickness are formed on the thermally oxidized silicon substrate, and then films of an Ru layer having a thickness of 1 nm, a CoFe layer having an object thickness and an NiFe layer having an object thickness are formed. Furthermore, a film of a Ta layer having a thickness of 3 nm is formed thereon, thereby bringing the basic structure of the laminated ferrimagnetic thin film according to the second example of the present invention to completion.

The thin film forming apparatus used in this example is a DC magnetron sputter apparatus including eight sputter targets each having a diameter of two inches, which is equal to that used in the embodiment 1. A degree of vacuum in a film forming chamber was $5\times10^{-9}$, and an argon gas pressure during sputtering was 3 mTorr.

The thus manufactured laminated ferrimagnetic thin film according to the second embodiment was cut out into a dimension of 1 cm×1 cm, its magnetic characteristic was evaluated by using a vibration sample type magnetometer, and its saturation magnetic field ($H_S$) and a saturation magnetic moment ($M_S\times t$) per unit film area of each of the first ferromagnetic layer 308 and the second ferromagnetic layer 309 were obtained like the first embodiment. Moreover, like the first embodiment, the magnitude of the anti-ferromagnetic exchange bonding energy in each sample was calculated by using the relational expression of $J=H_S\times(M_S\times t)/2$.

Figure 11:
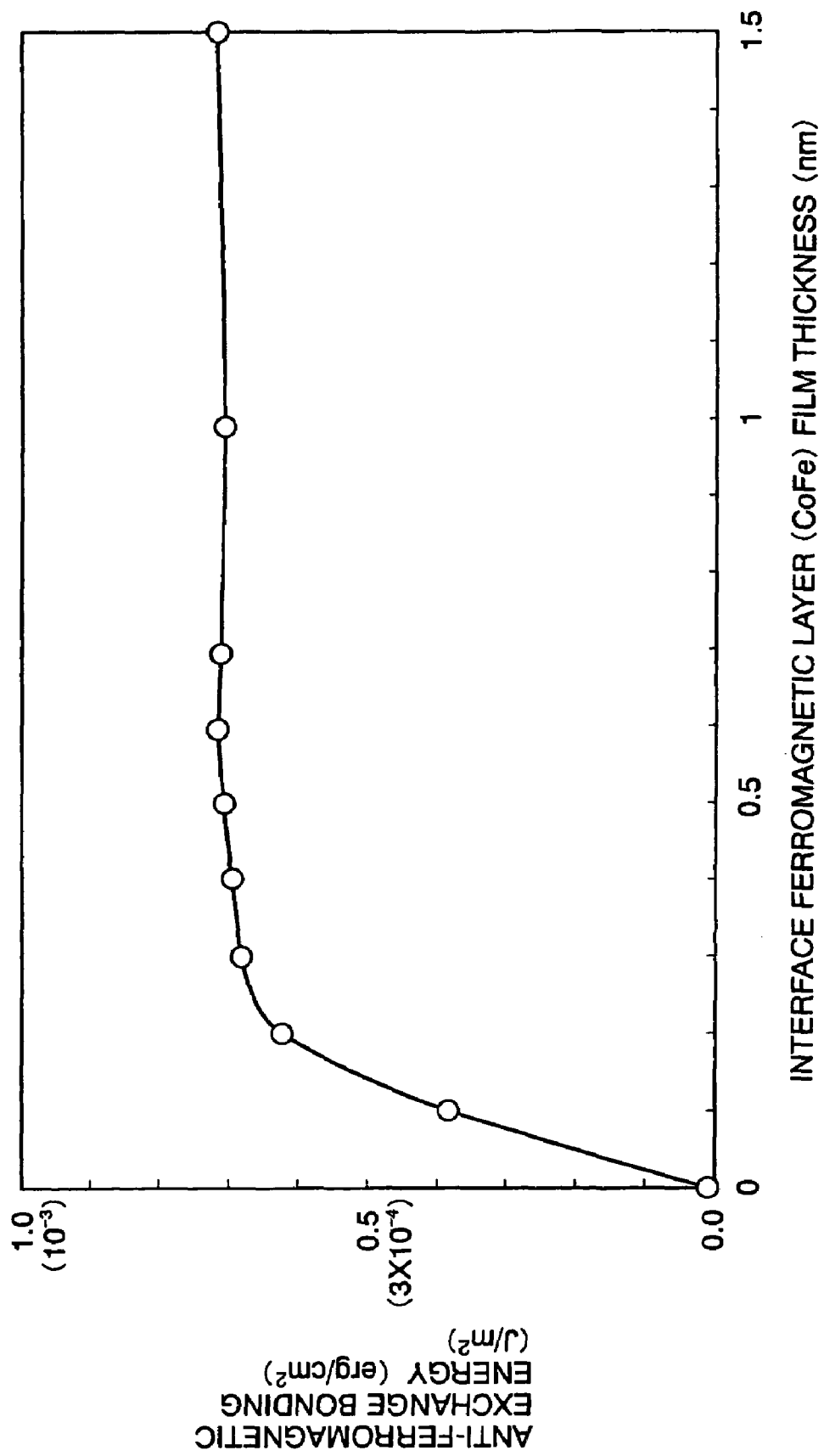
FIG. 11 is a view showing a relationship between an antiferromagnetic exchange bonding energy and an interface ferromagnetic layer (CoFe) film thickness in the laminated ferrimagnetic thi; film according to the second example.

FIG. 11 shows the relationship between the interface ferromagnetic layer (CoFe) film thickness of the laminated ferrimagnetic thin film according to the second example and the anti-ferromagnetic exchange bonding energy obtained in the above-described manner. It is to be noted that FIG. 11 also shows plotted points of the laminated ferrimagnetic thin film according to the first embodiment corresponding to the CoFe film thickness=0.5 nm and plotted points of the substrate/Ta (1.5 nm)/NiFe (7 nm)/Ru (1 nm)/NiFe (7 nm)/Ta (3 nm) corresponding to the CoFe film thickness=0 nm for reference.

From FIG. 11, it can be understood that the advantage appears, the anti-ferromagnetic exchange bonding between the ferromagnetic layers becomes firm and the margin relative to the Ru film thickness becomes large when the film thickness of the interface ferromagnetic layer (CoFe) is not less than 0.1 nm in the present invention. It is to be noted that, when the film thickness of the interface ferromagnetic layer (CoFe) is not less than 0.3 nm, the anti-ferromagnetic exchange bonding energy is $7\times10^{-4}$ $J/m^2$ (0.7 $erg/cm^2$), and its intensity and margin relative to the Ru film thickness are completely the same as those of the CoFe/Ru/CoFe-based thin film.

In addition, from this drawing, it can be understood that the bonding intensity is $6\times10^{-5}$ $J/m^2$ (0.06 $erg/cm^2$) which is very small, and the NiFe/Ru/NiFe-based coupling has the small bonding intensity and a narrow margin relative to the Ru film thickness when the present invention is not used (CoFe film thickness=0 nm).

It is to be noted that, even in the laminated ferrimagnetic thin film using Co, Co—Pt and Co—Cr as materials of the first interface ferromagnetic layer and the second interface ferromagnetic layer, the film thicknesses of the first interface ferromagnetic layer and the second interface ferromagnetic layer of at least 0.1 nm or above are required in order to obtain the advantages of the present invention.

THIRD EXAMPLE

Figure 12:
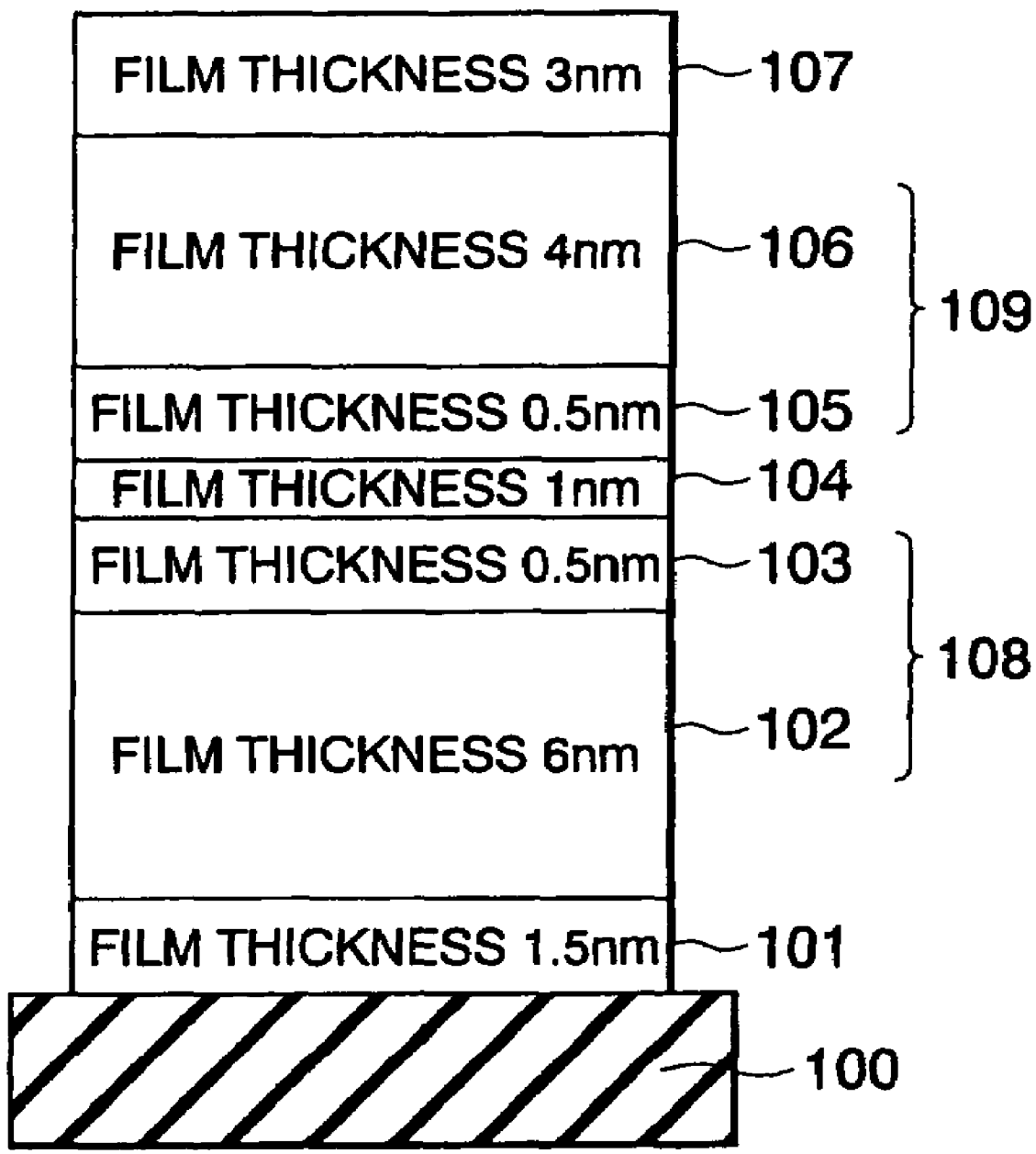
FIG. 12 is a cross-sectional view showing a basic film structure of a laminated ferrimagnetic thin film according to the third example.

As a practical example (third example) of the first embodiment according to the present invention, a laminated ferrimagnetic thin film was manufactured and its magnetic characteristic was evaluated. As shown in FIG. 12, the laminated ferrimagnetic thin film according to the third example has a laminated structure including a thermally oxidized silicon substrate 100/a first Ta layer 101/a first NiFe layer 102/a first CoFe layer 103/an Ru layer 104/a second CoFe layer 105/a second NiFe layer 106/a second Ta layer 107. Compositions of NiFe and CoFe used are $Ni_{0.8}Fe_{0.2}$ (Ni composition: 80 atom %) and $Co_{0.9}Fe_{0.1}$ (Co composition: 90 atom %).

In regard to a film thickness of each layer, as shown in the drawing, the first Ta layer 101 has a thickness of 1.5 nm; the first NiFe layer 102, 6 nm; the first CoFe layer 103, 0.5 nm; the Ru layer 104, 1 nm; the second CoFe layer 105, 0.5 nm; the second NiFe layer 106, 4 nm; and the second Ta layer 107, 3 nm. The thermally oxidized silicon substrate 100 was used as the substrate 300 according to the first embodiment; Ta 101 and 107, as the buffer layer 301 and the cap layer 307; the NiFe layers 102 and 106, as the first main ferromagnetic layer 302 and the second main ferromagnetic layer 306; the CoFe layers 103 and 105, as the first interface ferromagnetic layer 303 and the second interface ferromagnetic layer 305; and the Ru layer 104, as the non-magnetic intermediate layer 304.

The first NiFe layer 102 and the first CoFe layer 103 constitute the first ferromagnetic layer 108, and the second NiFe layer 106 and the second CoFe layer 105 constitute the second ferromagnetic layer 109. The first ferromagnetic layer 108 and the second ferromagnetic layer 109 are magnetically coupled in such a manner that directions of their magnetic moments become anti-parallel to each other by the anti-ferromagnetic exchange bonding effect through the Ru layer 104. As different from the first or the second embodiment, the laminated ferrimagnetic thin film according to the third embodiment has a difference in magnetic moment between the first ferromagnetic layer 108 and the second ferromagnetic layer 109. This is a structure suitable for evaluating the magnetic characteristic when the entire laminated ferrimagnetic thin film is subjected reversion of magnetization while maintaining magnetic coupling between the first ferromagnetic layer 108 and the second ferromagnetic layer 109 in the low magnetic field.

First, a film of the first Ta layer 101 having a thickness of 1.5 nm was formed on the thermally oxidized silicon substrate 100. Then, on the first Ta layer 101 were formed a film of the first NiFe layer 102 having a thickness of 6 nm, a film of the first CoFe layer 103 having a thickness of 0.5 nm, a film of the Ru layer having a thickness of 1 nm, a film of the second CoFe layer 105 having a thickness of 0.5 nm, and a film of the second NiFe layer having a thickness of 4 nm. Furthermore, a film of the second Ta layer 107 having a thickness of 3 nm was formed, thereby bringing the laminated ferrimagnetic thin film according to the third embodiment to completion.

The thin film forming apparatus used in this example is a DC magnetron sputter apparatus including eight sputter targets each having a diameter of two inches, which is equal to that used in the first embodiment. A degree of vacuum in a film forming chamber was $5 \times 10^{-9}$ Torr, and an argon gas pressure during sputtering was 3 mTorr.

The thus manufactured laminated ferrimagnetic thin film according to this embodiment was cut out into a dimension of 1 cm×1 cm, and its magnetic characteristic was evaluated by a vibration sample type magnetometer.

Figure 13:
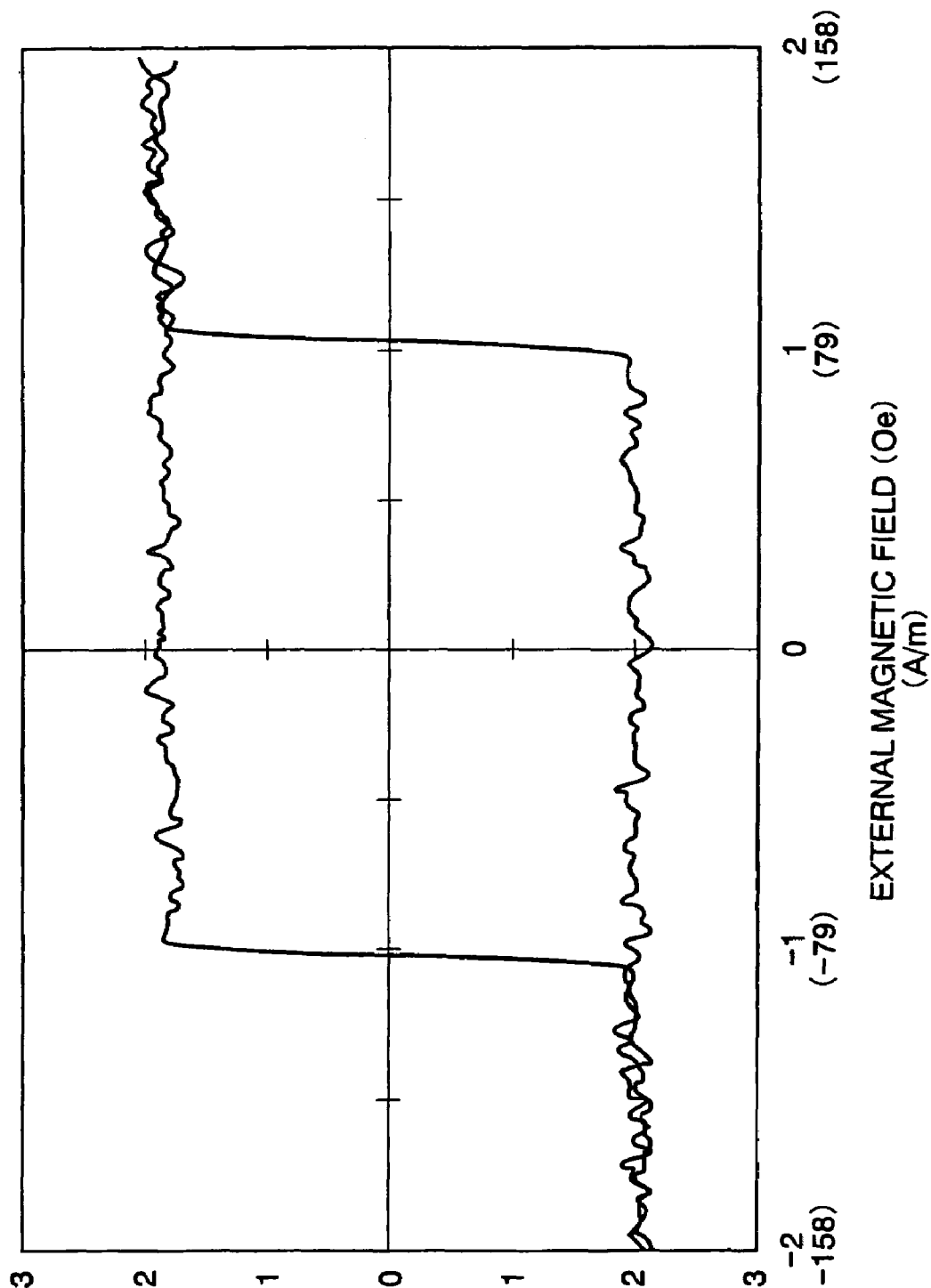
FIG. 13 is a view showing a relationship between an external magnetic field and a magnetic moment per unit film area in the laminated ferrimagnetic thin film according to the third example.

FIG. 13 show magnetization curves of the laminated ferrimagnetic thin film according to the third example. This drawing illustrates a change in the magnetic moment (vertical axis) per unit film area relative to a change in the external magnetic field (horizontal axis). As to the external magnetic field, reciprocating scanning was carried out in a range of −158 A/m (−2 (Oe)) to 158 A/m (2 (Oe)). In this magnetic field scanning range, anti-ferromagnetic coupling of the laminated ferri is unsaturated. It is to be noted that the saturation magnetic field of the laminated ferrimagnetic thin film according to this embodiment was additionally measured and its value was 316000 A/m (4000 (Oe)). Moreover, it was confirmed that the magnetic moment per unit film area at that time is 10 T·nm.

From this drawing, the effect of reducing the magnetic thin film in the low magnetic field of the laminated ferrimagnetic thin film according to the present invention can be confirmed. That is, in FIG. 13, when the external magnetic field is zero, the magnetic moment per unit film area is 2 T·nm. This indicates the state that the directions of the magnetic moments of the first ferromagnetic layer 108 and the second ferromagnetic layer 109 become antiparallel due to the anti-ferromagnetic exchange bonding acting therebetween and the magnitudes of the magnetic moments are partially canceled out. In this embodiment, there is a difference corresponding to 2 mm of NiFe between the magnetic film thicknesses of the first ferromagnetic layer 108 and the second ferromagnetic layer 109. Since the saturation magnetization ($M_S$) of NiFe is approximately 1 T, the 2 T·m magnetic moment per unit film area observed when the external magnetic field is zero completely matches with the designed magnetic film thickness difference. The hysteresis shown in the drawing indicates that the entire laminated ferrimagnetic thin film is subjected to magnetization reversion with the first ferromagnetic layer 108 and the second ferromagnetic layer 109 being magnetically coupled in the anti-ferromagnetic manner.

In addition, the reverting coercive force (which is referred to as the difference magnetization reverting coercive force ($H_C$) in this specification) and the reverted magnetic field are very small as approximately 79 A/m (1 (Oe)), and it can be understood that the laminated ferrimagnetic thin film according to this embodiment is sufficiently preferable as the free magnetic layer in the magneto-resistive effect element and has the excellent soft magnetic characteristic.

SECOND COMPARATIVE EXAMPLE

Figure 14:
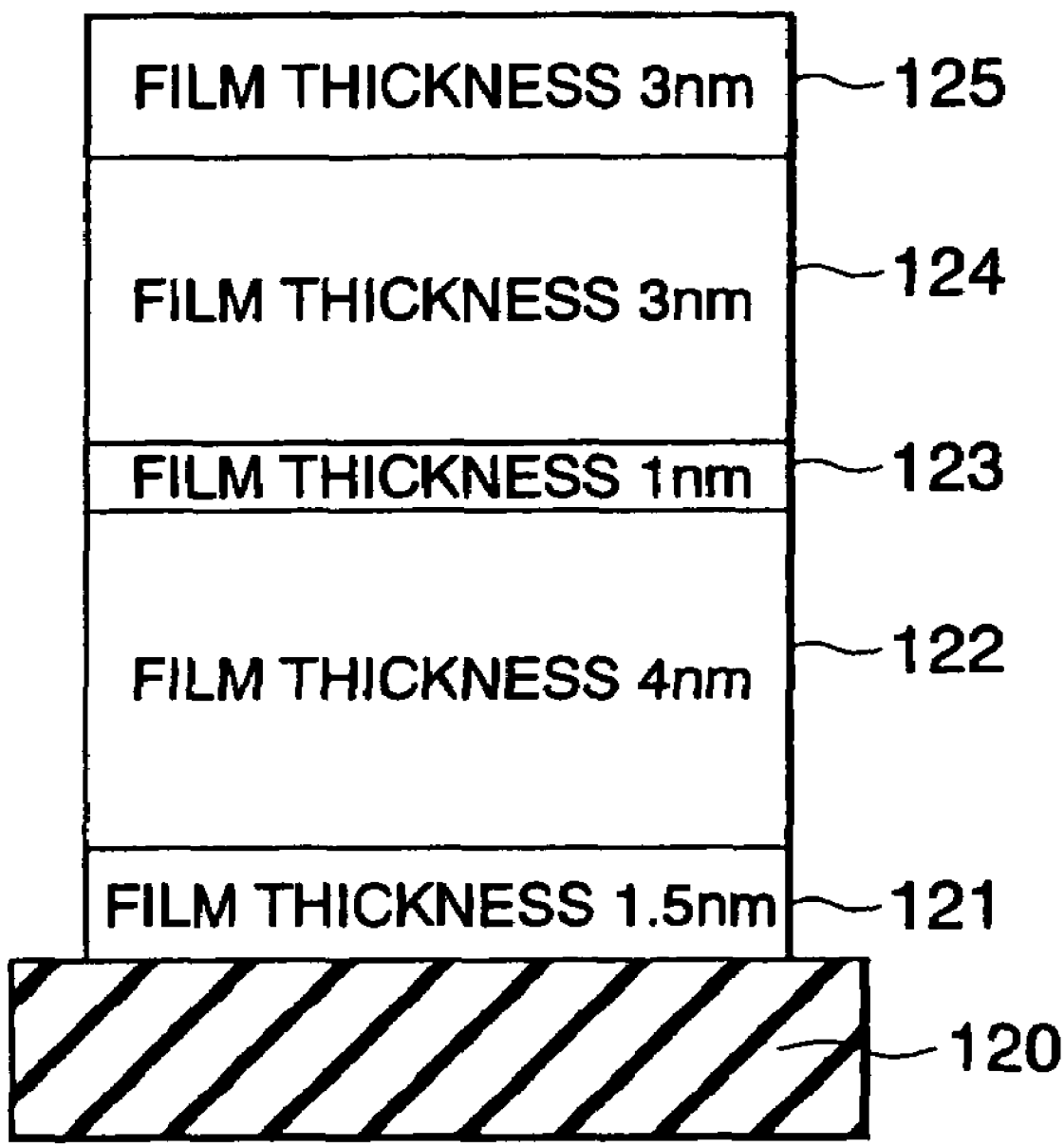
FIG. 14 is a cross-sectional view showing a basic film structure of a laminated ferrimagnetic thin film according to a second comparative example.

As a comparative example of the third embodiment, a conventional laminated ferrimagnetic thin film using CoFe was manufactured, and its magnetic characteristic was evaluated. As shown in FIG. 14, the laminated ferrimagnetic thin film according to the second comparative example has a laminated structure including a thermally oxidized silicon substrate 120/a first Ta layer 121/a first CoFe layer 122/an Ru layer 123/a second CoFe layer 124/a second Ta layer 125. Compositions of NiFe and CoFe used in this example are $Ni_{0.8}Fe_{0.2}$ (Ni composition: 80 atom %) and $Co_{0.9}Fe_{0.1}$ (Co composition: 90 atom %), respectively. In regard to a film thickness of each layer, as shown in the drawing, the first Ta layer 121 has a thickness of 1.5 nm; the first CoFe layer 122, 4 nm; the Ru layer 123, 1 nm; the second CoFe layer 124, 3 nm; and the second Ta layer 125, 3 nm. In this laminated ferrimagnetic thin film according to the second comparative example, the thermally oxidized silicon substrate is used as the substrate; Ta, as the buffer layer and the cap layer; CoFe, as the ferromagnetic layer; and Ru, as the non-magnetic intermediate layer.

The first CoFe layer 122 and the second CoFe layer 124 are magnetically coupled in such a manner that directions of their magnetic moments become anti-parallel due to the anti-ferromagnetic exchange bonding effect through the Ru layer 123. As different from the first comparative example, the laminated ferrimagnetic thin film according to the second embodiment is of a type that there is a difference in magnetic moment between the first CoFe layer 122 and the second CoFe layer 124, and has a structure suitable for evaluating the magnetic characteristic when the entire laminated ferrimagnetic thin film is subjected to magnetization reversion while maintaining magnetic coupling between the first CoFe layer 122 and the second CoFe layer 124 in the low magnetic field.

Description will now be given as to a method of forming this laminated ferrimagnetic thin film. First, a film of the first Ta layer 121 having a thickness of 1.5 nm was formed on the thermally oxidized silicon substrate 120. Then, on the first Ta layer 121 were formed a film of the first CoFe layer 122 having a thickness of 4 nm, a film of the Ru layer 123 having a thickness of 1 nm, and a film of the second CoFe layer 124 having a thickness of 3 nm. Additionally, a film of the second Ta layer 125 having a thickness of 3 nm was formed, thereby bringing the laminated ferrimagnetic thin film according to the second comparative example to completion.

The thin film forming apparatus used in this example is a DC magnetron sputter apparatus including eight sputter targets each having a diameter of two inches, which is the same as that used in the first embodiment. A degree of vacuum in a film forming chamber was $5 \times 10^{-9}$ Torr, and an argon gas pressure during sputtering was 3 mTorr.

The thus manufactured laminated ferrimagnetic thin film according to the second comparative example is cut out into a dimension of 1 cm×1 cm, and its magnetic characteristic was evaluated by using a vibration sample type magnetometer.

Figure 15:
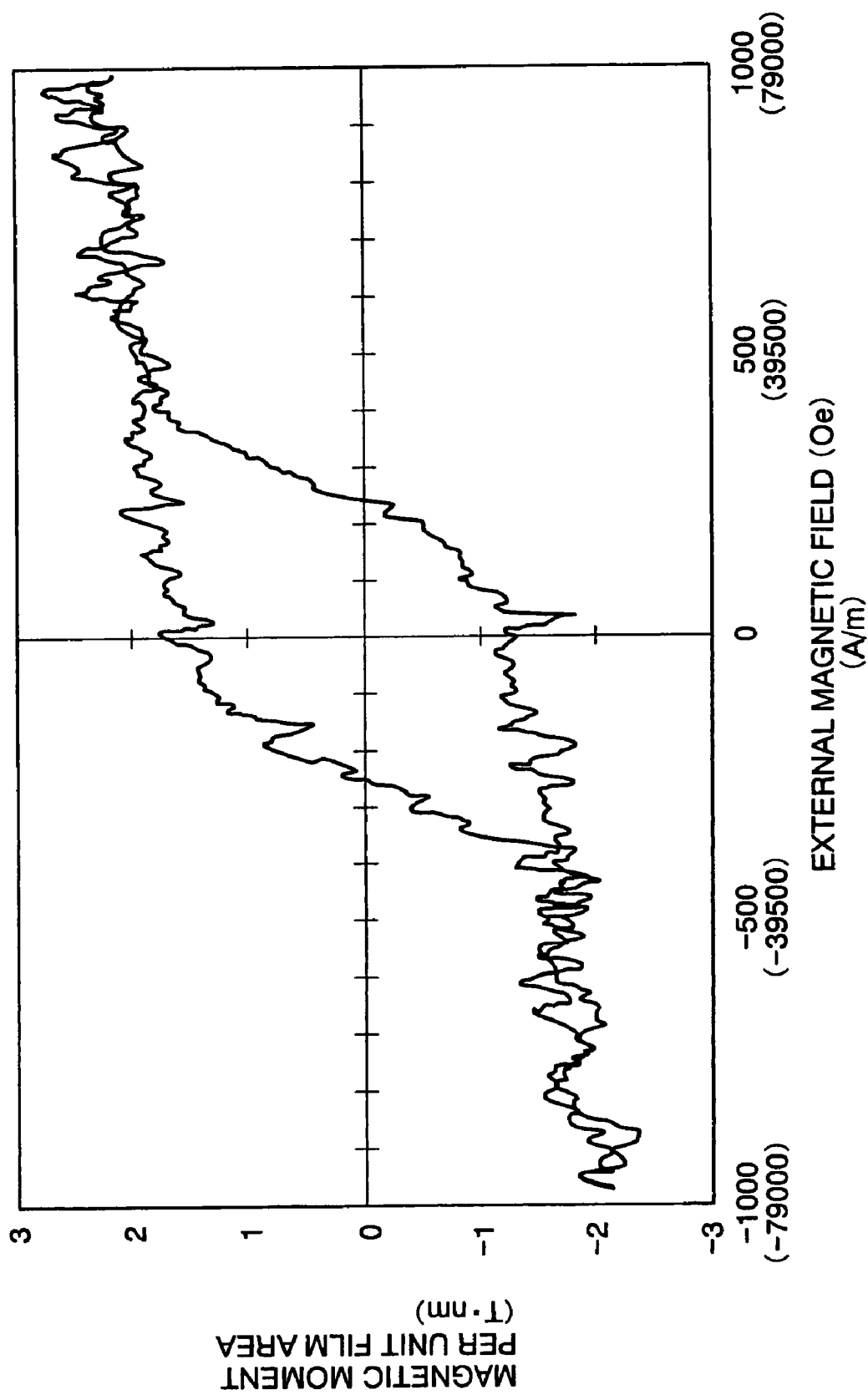
FIG. 15 is a view showing a relationship between an external magnetic field and a magnetic moment per unit film area in the laminated ferrimagnetic thin film according to the second comparative example.

FIG. 15 shows magnetization curves of the laminated ferrimagnetic thin film according to the second comparative example. This drawing illustrates a change in the magnetic moment (vertical axis) per unit film area relative to a change in the external magnetic filed (horizontal axis). As to the external magnetic field, reciprocating scanning was carried out in a range of −79000 A/m (−1000 (Oe)) to 7900 A/m (1000 (Oe)). In this magnetic field scanning range, the anti-ferromagnetic coupling of the laminated ferri is unsaturated. By additional measurement, it was confirmed that the saturation magnetic field of the laminated ferrimagnetic thin film according to the second comparative example is 316000 A/m (4000 (Oe)) and the magnetic moment per unit film area at that time is 9.9 T·nm.

From this drawing, it is possible to confirm the effect of reducing the magnetic film thickness in the low magnetic field like the third embodiment. That is, in FIG. 15, the magnetic moment per unit film area is approximately 2 T·nm when the external magnetic field is zero. This indicates a state that directions of the magnetic moments of the first CoFe layer 122 and the second CoFe layer 124 become anti-parallel to each other due to the antiferromagnetic exchange bonding acting between them and the magnitudes of the magnetic moments are partially canceled out. In the second comparative example, a difference corresponding to 1 nm of CoFe is provided to the magnetic film thicknesses of the first CoFe layer 122 and the second CoFe layer 124. Since the saturation magnetization ($M_s$) of CoFe is approximately 2 T, the 2 T·nm magnetic moment per unit film area observed when the external magnetic field is zero matches with the designed magnetic film thickness difference. The hysteresis shown in the drawing indicates that the entire laminated ferrimagnetic thin film is subjected to magnetization reversal while maintaining the magnetic coupling of the first CoFe layer 122 and the second CoFe layer 124 in the anti-ferromagnetic manner.

However, its reverting coercive force is 19750 A/m and its reverted magnetic field is approximately 39500 A/m, which are very large values. Since the magnetic field required for magnetization reversal is too large, the laminated ferrimagnetic thin film according to the second comparative example is not suitable as the free magnetic layer of the magnetoresistive effect element at all.

Based on comparison between the first embodiment and the first comparative example and comparison between the second embodiment and the second comparative example, it can be understood that the CoFe/Ru/CoFe-based laminated ferrimagnetic thin film has firm antiferromagnetic bonding with a large margin with respect to the Ru film thickness but is inferior in the soft magnetic characteristic during difference magnetization reversion and that the laminated ferrimagnetic thin film according to the present invention can simultaneously realize firm antiferromagnetic bonding with a large margin with respect to the Ru film thickness and the soft magnetic characteristic during difference magnetization reversion.

FOURTH EXAMPLE

In the laminated ferrimagnetic thin film according to the present invention having the same structure as that of the third embodiment, a plurality of samples having varied ratios of the main ferromagnetic layer (NiFe) and the interface ferromagnetic layer (CoFe) were manufactured, and the relationship between a percentage of NiFe and the advantage of the present invention (soft magnetic characteristic) was examined. Like the third embodiment, the structure of the laminated ferrimagnetic thin film according to the fourth embodiment is of a type that a thermally oxidized silicon substrate is used as the substrate 300 according to the first embodiment; Ta, as the buffer layer 301 and the cap layer 307; NiFe, as the first main ferromagnetic layer 302 and the second main ferromagnetic layer 306; CoFe as the first interface ferromagnetic layer 303 and the second interface ferromagnetic layer 305; and Ru, as the non-magnetic intermediate layer 304. However, film thicknesses of the first main ferromagnetic layer 302 and the second main ferromagnetic layer 306 and film thicknesses of the first interface ferromagnetic layer 303 and the second interface ferromagnetic layer 305 are different from those in the third embodiment.

Film structures of the manufactured samples according to the fourth embodiment are as show in Table 2. A numeric figure in each parenthesis is indicative of a film thickness (nm) of each layer.

TABLE 2

| Sample 11 | Substrate / Ta (1.5 nm) / NiFe (3 nm) / CoFe (0.5 nm) / Ru (1 nm) / CoFe (0.5 nm) / NiFe (2 nm) / Ta (3 nm) |
|---|---|
| Sample 12 | Substrate / Ta (1.5 nm) / NiFe (3 nm) / CoFe (0.6 7 nm) / Ru (1 nm) / CoFe (0.67 nm) / NiFe (2 nm) / Ta (3 nm) |
| Sample 13 | Substrate / Ta (1.5 nm) / NiFe (3 nm) / CoFe (1.0 nm) / Ru (1 nm) / CoFe (1.0 nm) / NiFe (2 nm) / Ta (3 nm) |
| Sample 14 | Substrate / Ta (1.5 nm) / NiFe (3 nm) / CoFe (1.3 nm) / Ru (1 nm) / CoFe (1.3 nm) / NiFe (2 nm) / Ta (3 nm) |
| Sample 15 | Substrate / Ta (1.5 nm) / NiFe (3 nm) / CoFe (1.5 nm) / Ru (1 nm) / CoFe (1.5 nm) / NiFe (2 nm) / Ta (3 nm) |
| Sample 16 | Substrate / Ta (1.5 nm) / NiFe (3 nm) / CoFe (2.0 nm) / Ru (1 nm) / CoFe (2.0 nm) / NiFe (2 nm) / Ta (3 nm) |
| Sample 17 | Substrate / Ta (1.5 nm) / NiFe (3 nm) / CoFe (3.0 nm) / Ru (1 nm) / CoFe (3.0 nm) / NiFe (2 nm) / Ta (3 nm) |
| Sample 18 | Substrate / Ta (1.5 nm) / NiFe (3 nm) / CoFe (4.0 nm) / Ru (1 nm) / CoFe (4.0 nm) / NiFe (2 nm) / Ta (3 nm) |
| Sample 19 | Substrate / Ta (1.5 nm) / NiFe (3 nm) / CoFe (6.0 nm) / Ru (1 nm) / CoFe (6.0 nm) / NiFe (2 nm) / Ta (3 nm) |

By determining a film thickness of the first main ferromagnetic layer 302 as 3 nm and a film thickness of the second main ferromagnetic layer 306 as 2 nm, a difference is provided to the magnetic moments of the first ferromagnetic layer 308 and the second ferromagnetic layer 309. Further, by varying film thicknesses of the first interface ferromagnetic layer 303 and the second interface ferromagnetic layer 305 in a range of 0.5 nm to 6 nm, a percentage of the main ferromagnetic layer (NiFe) film thickness in each ferromagnetic layer is changed in a range of 25 to 86%.

The manufacturing method is substantially the same as the third example. First, a film of a Ta layer having a thickness of 1.5 nm, a film of an NiFe layer having a thickness of an object thickness and a film of a CoFe layer having an object thickness were formed on the thermally oxidized silicon substrate. Then, a film of an Ru layer having a thickness of 1 nm, a film of a CoFe layer having an object thickness and a film of an NiFe layer having an object thickness were formed thereon. Furthermore, a film of the Ta layer having a thickness of 3 nm was formed thereon, thereby bringing the laminated ferrimagnetic thin film according to the fourth embodiment of the present invention to completion.

The thin film forming apparatus used in this example is a DC magnetron sputter apparatus including eight sputter targets each having a diameter of two inches, which is equal to that used in the first embodiment. A degree of vacuum in a film forming chamber was 5×10-9 Torr, and an argon gas pressure during sputtering was 3 mTorr.

The thus manufactured laminated ferrimagnetic thin film according to the fourth example was cut out into a dimension of 1 cm×1 cm, and its magnetic characteristic was evaluated by using a vibration sample type magnetometer.

The difference magnetization reversion having the magnitude (1 T·nm) corresponding to the designed magnetic film thickness difference (NiFe: 1 nm) was observed in every sample in the vicinity of the zero magnetic field. Like the third embodiment, the difference magnetization reverting coercive force ($H_C$) in each sample was evaluated.

Figure 16:
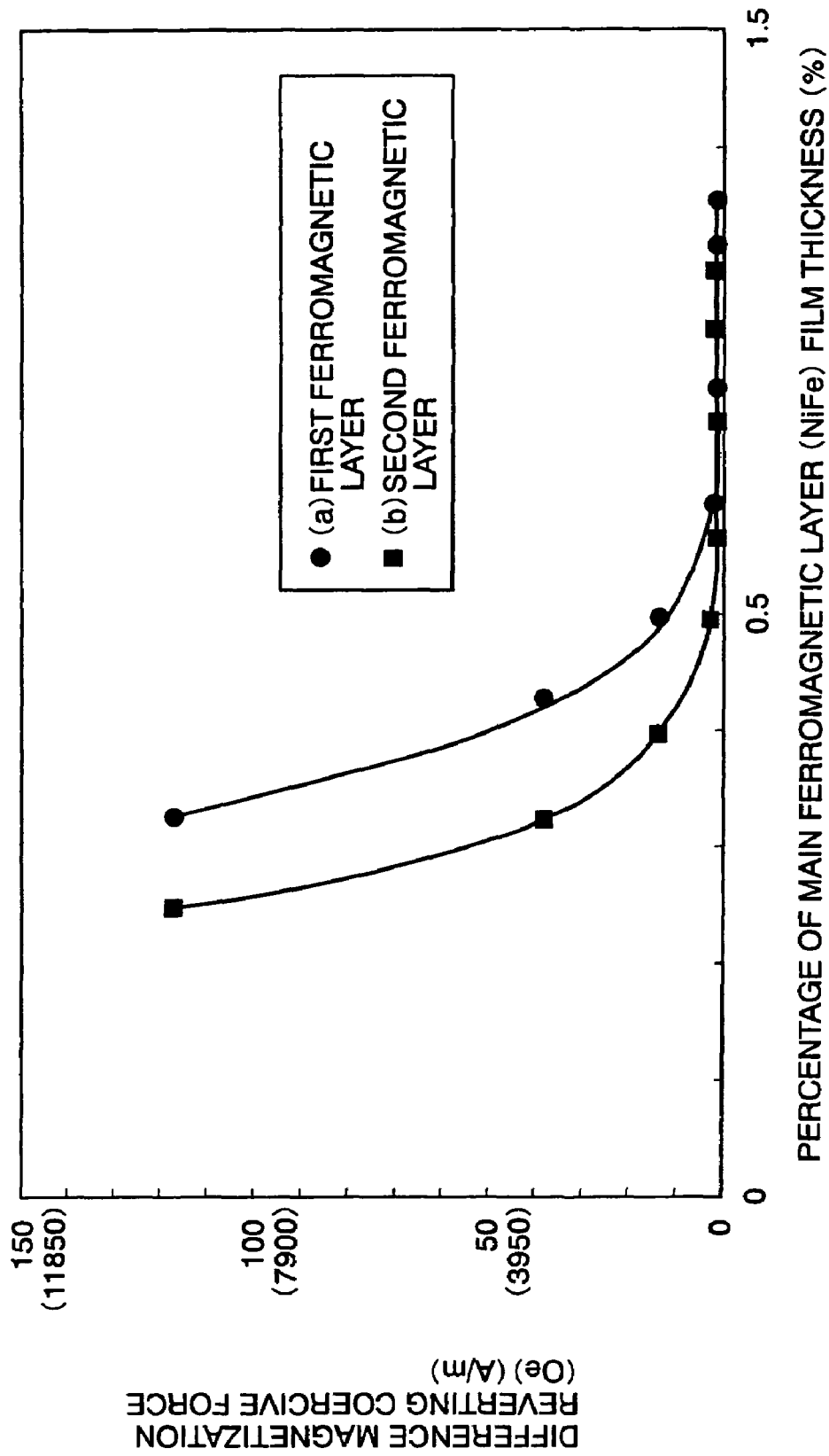
FIG. 16 is a view showing a relationship between a difference magnetization reversion coercive force ($H_C$) and a percentage (%) of a main ferromagnetic layer (NiFe) film thickness in each ferromagnetic layer in a laminated ferrimagnetic thin film according to a fourth example.

FIG. 16 is a graph showing the relationship between a percentage of the main ferromagnetic layer (NiFe) film thickness in each ferromagnetic layer and the difference magnetization reverting coercive force ($H_C$) of the laminated ferrimagnetic thin film according to the fourth example obtained in the above-described manner.

The coercive force of NiFe (main ferromagnetic layer material) is 79 A/m (1 (Oe)). From FIG. 16, it can be understood that the difference magnetization reverting coercive force of the laminated ferrimagnetic thin film according to the present invention is reduced to be equivalent to the coercive force of the main ferromagnetic layer material when the percentage of each main ferromagnetic layer (NiFe) film thickness in the first ferromagnetic layer and the second ferromagnetic layer is at least 60% or above.

It is to be noted that the similar advantage was observed in the laminated ferrimagnetic thin film using Ni, Ni—Fe—Nb, Ni—Fe—B and Ni—Fe—Co as materials of the first main ferromagnetic layer and the second main ferromagnetic layer, and the difference magnetization reverting coercive force matched with the coercive force of the main ferromagnetic layer material when the percentage of the main ferromagnetic layer film thickness in each ferromagnetic layer is at least 60% or above in any case.

The laminated ferrimagnetic thin film according to the present invention can simultaneously realize the ferromagnetic exchange bonding which has the firmness equivalent to that of the Co-based laminated ferrimagnetic thin film and has a large margin with respect to the Ru film thickness, and the excellent soft magnetic characteristic equivalent to that of the Ni-based magnetic material.

FIFTH EXAMPLE

Figure 17:
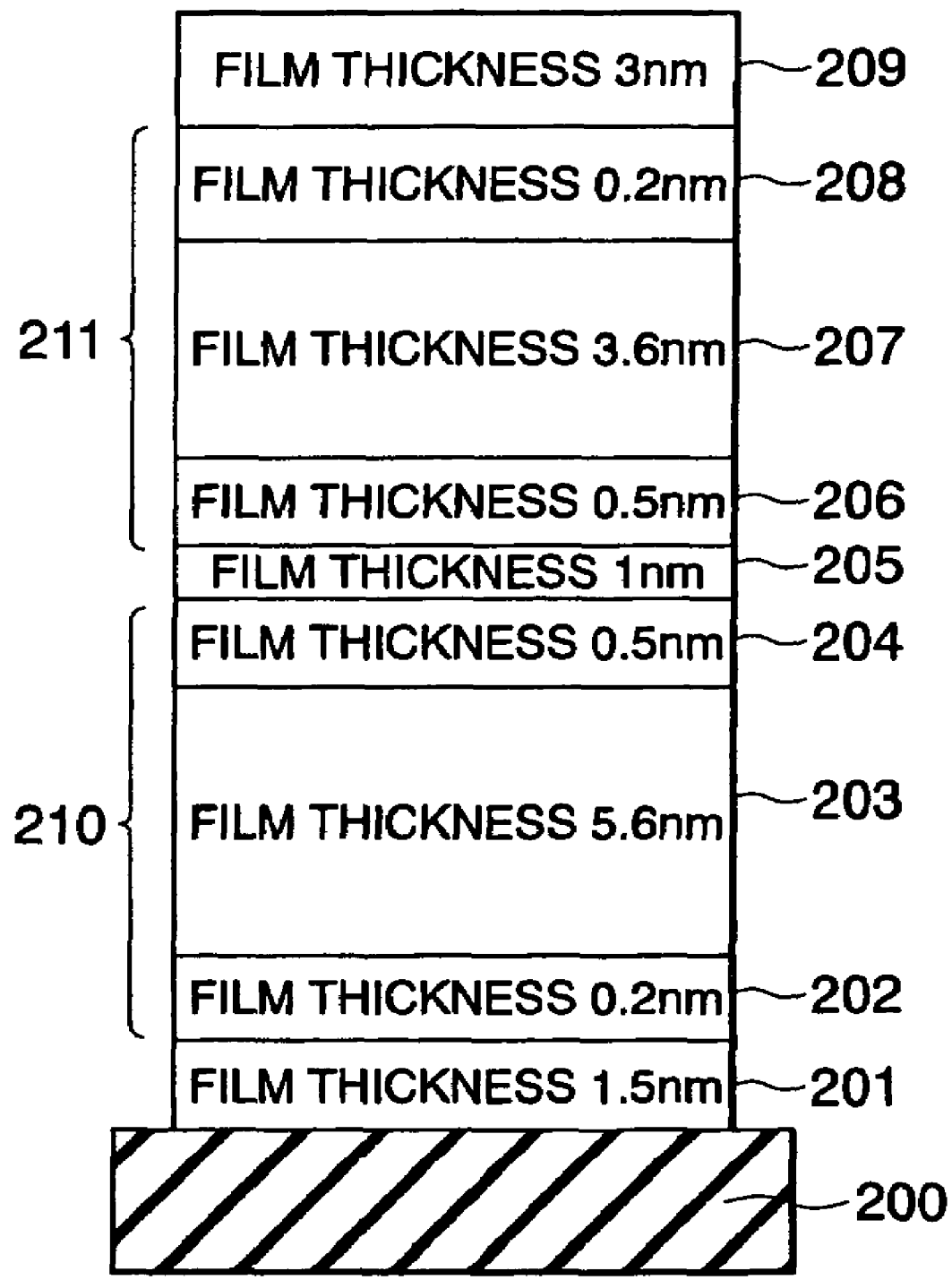
FIG. 17 is a cross-sectional view showing a basic film structure of a laminated ferrimagnetic thin film according to a fifth example.

As a practical example (fifth example) of the second embodiment according to the present invention, the laminated ferrimagnetic thin film according to the present invention was manufactured and its magnetic characteristic was evaluated. As shown in FIG. 17, the laminated ferrimagnetic thin film according to the fifth embodiment has a laminated structure including a thermally oxidized silicon substrate 200/a first Ta layer 201/a first CoFe layer 202/a first NiFe layer 203/a second CoFe layer 204/an Ru layer 205/a third CoFe layer 206/a second NiFe layer 207/a fourth CoFe layer 208/a second Ta layer 209. A composition of each of the first NiFe layer 203 and the second NiFe layer 207 is $Ni_{0.8}Fe_{0.2}$ (Ni composition: 80 atom %). Further, a composition of each of the first CoFe layer 202 and the fourth CoFe layer 208 is $Cu_{0.3}Fe_{0.7}$ (Co composition: 30 atom %), and a composition of each of the second CoFe layer 204 and the third CoFe layer 206 is $Co_{0.9}Fe_{0.1}$ (Co composition: 90 atom %). In regard to a film thickness of each layer, as shown in the drawing, the first Ta layer 201 has a thickness of 1.5 nm; the first CoFe layer 202, 0.2 nm; the first NiFe layer 203, 5.6 nm; the second CoFe layer 204, 0.5 nm; the Ru layer 205, 1 nm; the third CoFe layer 206, 0.5 nm; the second NiFe layer 207, 3.6 nm; the fourth CoFe layer 208, 0.2 nm; and the second Ta layer 209, 3 nm. In the fifth embodiment, the thermally oxidized silicon substrate is used as the substrate 600 in the second embodiment; Ta, as the buffer layer 601 and the cap layer 609; $Cu_{0.3}Fe_{0.7}$, as the first ferromagnetic layer 602 and the fourth ferromagnetic layer 608; NiFe, as the second ferromagnetic layer 603 and the third ferromagnetic layer 607; $Co_{0.9}Fe_{0.1}$, the first interface ferromagnetic layer 604 and the second interface ferromagnetic layer 606; and Ru, as the non-magnetic intermediate layer 605.

The first CoFe layer 202, the first NiFe layer 203 ant the second CoFe layer 204 constitute the first ferromagnetic layer 210, and the third CoFe layer 206, the second NiFe layer 207 and the fourth CoFe layer 208 constitute the second ferromagnetic layer 211. The first ferromagnetic layer 210 and the second ferromagnetic layer 211 are magnetically coupled in such a manner that directions of magnetic moments thereof become anti-parallel to each other due to the anti-ferromagnetic exchange bonding effect through the Ru layer 205. A difference is provided to the magnetic moments of the first ferromagnetic layer 210 and the second ferromagnetic layer 211.

First, a film of the first Ta layer 201 having a thickness of 1.5 nm was formed on the thermally oxidized silicon substrate 200. Then, on the first Ta layer 201 were formed a film of the first CoFe layer 202 having a thickness of 0.2 nm, a film of the first NiFe layer 203 having a thickness of 5.6 nm, a film of the second CoFe layer 204 having a thickness of 0.5 nm, the Ru layer 205 having a thickness of 1 nm, a film of the third CoFe layer 206 having a thickness of 0.5 nm, a film of the second NiFe layer 207 having a thickness of 3.6 nm, and a film of the fourth CoFe layer 208 having a thickness of 0.2 nm. Furthermore, a film of the second Ta layer 209 having a thickness of 3 nm was formed thereon, thereby bringing the laminated ferrimagnetic thin film according to the fifth embodiment to completion.

The thin film forming apparatus used in this example is a DC magnetron sputter apparatus including eight sputter targets each having a diameter of two inches, which is equal to that used in the first embodiment. A degree of vacuum in a film forming chamber is $5 \times 10^{-9}$ Torr, and an argon gas pressure during sputtering is 3 mTorr.

The thus manufactured laminated ferrimagnetic thin film according to the present invention was cut out into a dimension of 1 cm×1 cm and its magnetic characteristic was evaluated by using a vibration sample type magnetometer.

In the fifth example, the difference magnetization reversion of 2 T·nm with $H_C$=79 A/m (1 (Oe)) like that in the third embodiment was observed. The laminated ferrimagnetic thin film according to this example has the excellent soft magnetic characteristic which is sufficiently preferable as the free magnetic layer in the magneto-resistive effect element. Moreover, when the laminated ferrimagnetic thin film according to the fifth example is used for the free magnetic layer in the ferromagnetic tunnel junction element, the element MR ratio is also improved since a material with a high spin polarization ratio comes into contact with the tunnel barrier.

It is to be noted that the difference magnetization reverting coercive force ($H_C$) becomes 79 A/m (1 (Oe)) when the percentage of the NiFe layer film thickness in the first and second ferromagnetic layers is not less than 60%.

SIXTH EXAMPLE

Figure 18:
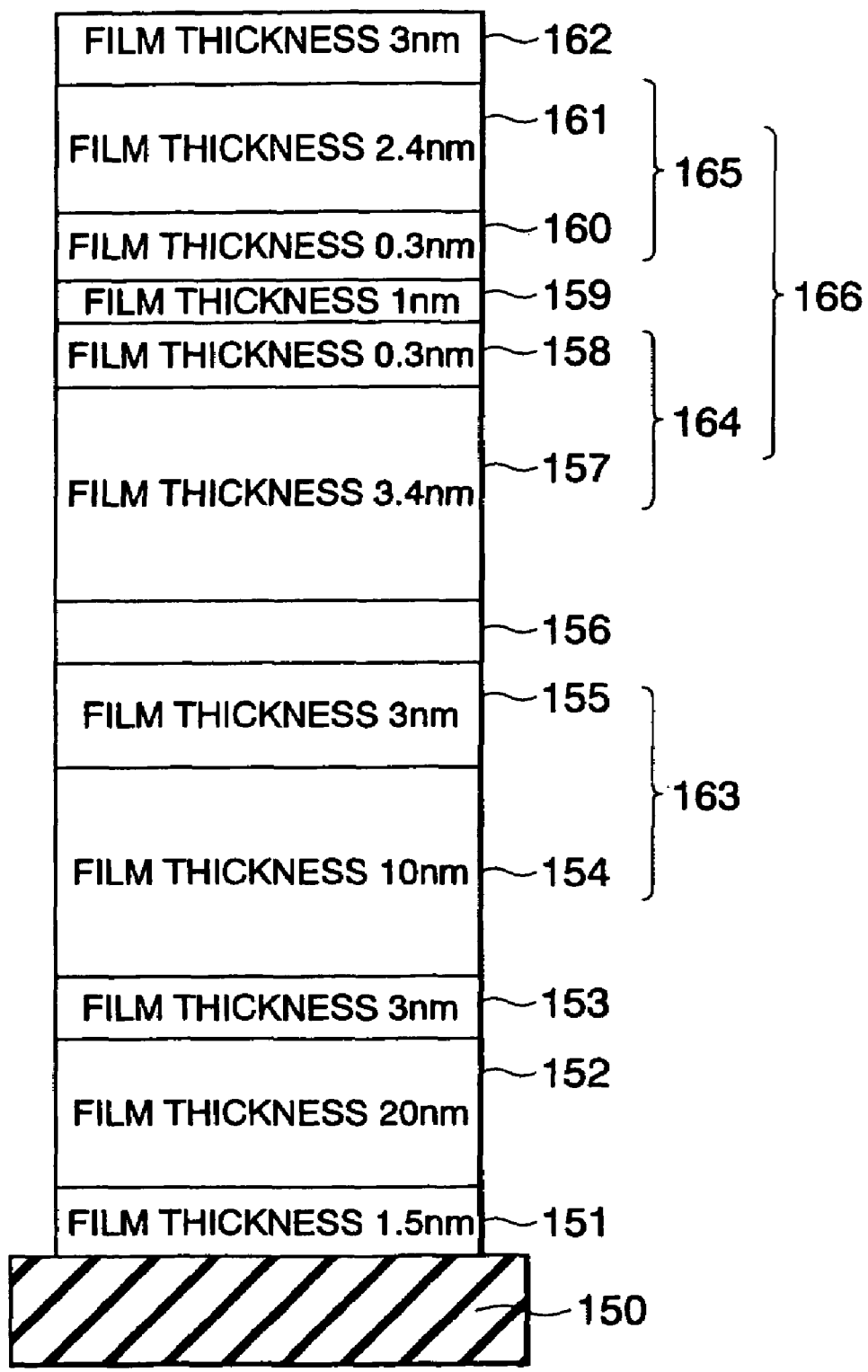
FIG. 18 is a cross-sectional view showing a basic film structure of a ferromagnetic tunnel junction element according to a sixth example.

As a practical example (sixth example) of the third embodiment according to the present invention, a magnetoresistive effect element was manufactured. The sixth example is a ferromagnetic tunnel junction element using the laminated ferrimagnetic thin film according to the first embodiment of the present invention as its free magnetic layer. As shown in FIG. 18, the ferromagnetic tunnel junction element according to the sixth example has a laminated structure including a thermally oxidized silicon substrate 150/a first Ta layer 151/an Al layer 152/a second Ta layer 153/an IrMn layer 154/a third CoFe layer 155/a tunnel barrier layer 156/a first NiFe layer 157/a first CoFe layer 158/an Ru layer 159/a second CoFe layer 160/a second NiFe layer 161/a Ta layer (3) 162. Compositions of NiFe and CoFe used in this example are $Ni_{0.8}Fe_{0.2}$ (Ni composition: 80 atom %) and $Co_{0.9}Fe_{0.1}$ (Co composition: 90 atom %), respectively. In regard to a film thickness of each layer, as shown in the drawing, the first Ta layer 151 has a thickness of 1.5 nm; the Al layer 152, 20 nm; the second Ta layer 153, 3 nm; the IrMn layer 154, 10 nm; the third CoFe layer 155, 3 nm; the first NiFe layer 157, 3.4 nm; the first CoFe layer 158, 0.3 nm; the Ru layer 159, 1 nm; the second CoFe layer 160, 0.3 nm; the second NiFe layer 161, 2.4 nm; and the Ta layer (3) 162, 3 nm. This is the structure which is of a type that thermally oxidized silicon substrate is used as the substrate 400 in the third embodiment; Al, as the underlying electrode layer 402; Ta, as all of the first buffer layer 401, the second buffer layer 403 and the cap layer 411; NiFe, as the first main ferromagnetic layer 406 and the second main ferromagnetic layer 410; CoFe, as the first interface ferromagnetic layer 407 and the second interface ferromagnetic layer 409; and Ru, as the non-magnetic intermediate layer 408. As the non-magnetic layer 405, a tunnel barrier layer 156 which is an insulator was used. In addition, the pinned magnetic layer 404 has a two-layer structure including the IrMn layer 154/the third CoFe layer 155, and this element is of a type (exchange biased type) that the magnetization direction of the third CoFe layer is fixed by a combination with the IrMn layer which is an antiferromagnetic body. It is to be noted that an oxide of Al was used for the tunnel barrier layer 156.

The first NiFe layer 157 and the first CoFe layer 158 constitute the first free magnetic layer 164, and the second NiFe layer 161 and the second CoFe layer 160 constitute the second free magnetic layer 165. The first free magnetic layer 164 and the second free magnetic layer 165 are magnetically coupled in such a manner that directions of magnetic moments thereof become anti-parallel to each other due to the anti-ferromagnetic exchange bonding effect through the Ru layer 159, and function as the free magnetic layer. The first free magnetic layer 164, the Ru layer 159 and the second free magnetic layer 165 as a whole serve as the free magnetic layer 166. A difference is provided to the magnetic moments of the first free magnetic layer 164 and the second free magnetic layer 165.

First, on the thermally oxidized silicon substrate 150 were formed a film of the first Ta layer 151 having a thickness of 1.5 nm, a film of the Al layer 152 having a thickness of 20 nm, a film of the second Ta layer 153 having a thickness of 3 nm, a film of the IrMn layer 154 having a thickness of 10 nm, and a film of the third CoFe layer 155 having a thickness of 3 nm. Then, a film of Al having a thickness of 2.2 nm was formed thereon as a metal layer which can function as a tunnel barrier layer. The pure oxygen with 0.05 mTorr was introduced in vacuo, and a tunnel barrier layer 156 was formed by an oxidizing process (100 watt, 100 minutes) using a plasma gun. The introduced pure oxygen was completely exhausted, and the high-vacuum state was restored. Then, a film of the first NiFe layer 157 having a thickness of 3.4 nm, a film of the first CoFe layer 158 having a thickness of 0.3 nm, a film of the Ru layer 159 having a thickness of 1 nm, a film of the second CoFe layer 160 having a thickness of 0.3 nm, a film of the second NiFe layer 161 having a thickness of 2.4 nm, and a film of the third Ta layer 162 having a thickness of 3 nm were formed, thereby bringing the multi-layer thin film structure of the magnetoresistive effect element according to the sixth embodiment to completion.

The thin film forming apparatus used in this example is a DC magnetron sputter apparatus including eight sputter targets each having a diameter of two inches, which is equal to that used in the first embodiment. A degree of vacuum in a film forming chamber was $5 \times 10^{-9}$ Torr, and an argon gas pressure during sputtering was 3 mTorr.

Then, the finished ferromagnetic tunnel junction film was processed into a junction element shape by using the optical exposure and electron ray exposure techniques and the ion milling technique. The steps will now be described with reference to FIG. 19. FIGS. 19A to 19G are views showing the element shape manufacturing steps of the ferromagnetic tunnel junction film according to the sixth example. For simplifying the drawings, the first Ta layer 151/the Al layer 152/the second Ta layer 153 in FIG. 18 are written as the underlying electrode layer 71, and the IrMn layer 154/the third CoFe layer 155 are written as the pinned magnetic layer 72. Additionally, the first NiFe layer 157/the first CoFe layer 158/the Ru layer 159/the second CoFe layer 160/the second NiFe layer 161/the third Ta layer 162 are written as the free magnetic layer 74. It is to be noted that the tunnel barrier layer 156 corresponds to the tunnel barrier layer 73.

Figure 19A:
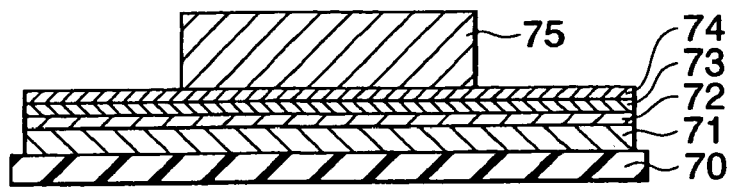
FIGS. 19A through 19G are views showing a element shape manufacturing process of a ferromagnetic tunnel junction element according to the sixth embodiment and a seventh example.
Figure 19B:
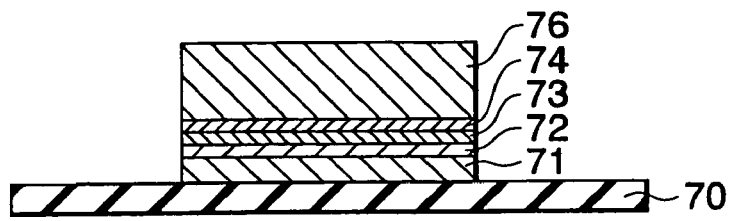

First, a photoresist 75 having an underlying electrode shape was formed by using the optical exposure technique on the multi-layer film surface of the sixth embodiment which had been through film formation by the above-described method as shown in FIG. 19A, and all the layers in the bonded film structure were processed into the wiring pattern shape of the underlying electrode by ion milling as shown in FIG. 19B.

Figure 19C:
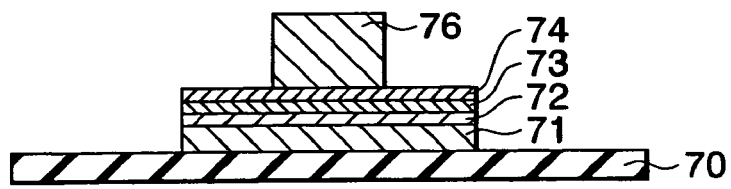
Figure 19D:
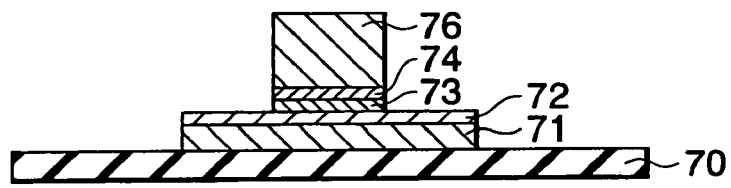

Then, after removing the photoresist 75, an electron beam resist 76 which defines the bonding dimension was formed on the film surface by using the electron ray exposure technique as shown in FIG. 19C, and ion milling was applied up to the upper part of the pinned magnetic layer 72 as shown in FIG. 19D.

Figure 19E:
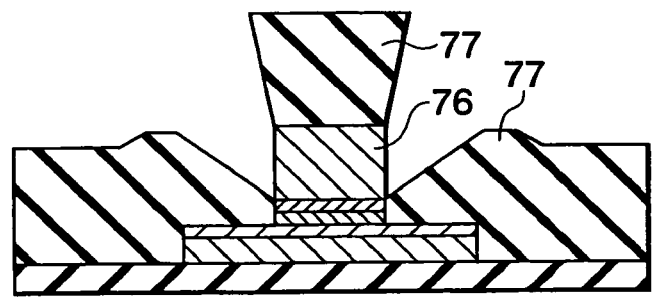
Figure 19F:
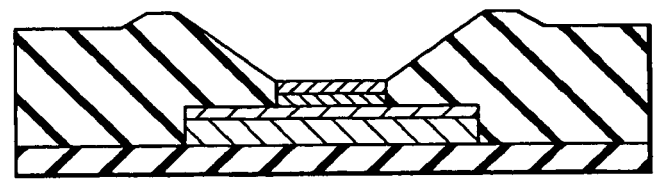
Figure 19G:
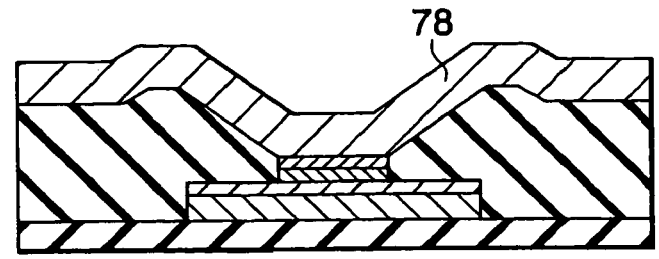

The inter-electrode insulating layer 77 was deposited and formed while leaving the electron beam resist 76 as shown in FIG. 19E, and thereafter the electron beam resist 76 was removed as shown in FIG. 19F. Alumina was used for the inter-electrode insulating layer 77. Furthermore, as shown in FIG. 19G, the respective steps of photoresist formation, deposition and formation of the Al film, and lift-off of the photoresist were sequentially performed on the inter-electrode insulating layer 77 by using the optical exposure technique, thereby forming an upper electrode layer 78 having the wiring pattern of the upper electrode. This is the end of element shape processing of the ferromagnetic tunnel junction film.

As to the finished ferromagnetic tunnel junction element, a resistance change in the magnetic field was measured by the direct current quadrupole method and the characteristic was evaluated. As the characteristic of the ferromagnetic tunnel junction element (junction area=0.052 µm$^2$) according to the sixth embodiment, the standardized bonding resistance was 1 MΩµm$^2$, the MR ratio was 32%, and the reverting magnetic field of the free magnetic layer when the magnetic field was applied in the direction of 45 degrees from the magnetization facilitating axis was 395 A/m (5 (Oe)), which are very preferable for the application to a high density solid-state magnetic memory (MRAM) or a high recording density compatible magnetic head.

Incidentally, when the magnetic characteristic evaluation using the vibration sample type magnetometer was additionally carried out with respect to a sample according to the sixth embodiment which had been through film formation of the multi-layer film structure by the above-described method, the difference magnetization reversion of 1 T·nm was observed.

SEVENTH EXAMPLE

As a practical example (seventh example) of the fourth embodiment according to the present invention, the magneto-resistive effect element according to the present invention was manufactured. The seventh example is a ferromagnetic tunnel junction element using the laminated ferrimagnetic thin film according to the second embodiment of the present invention as its free magnetic layer.

Figure 20:
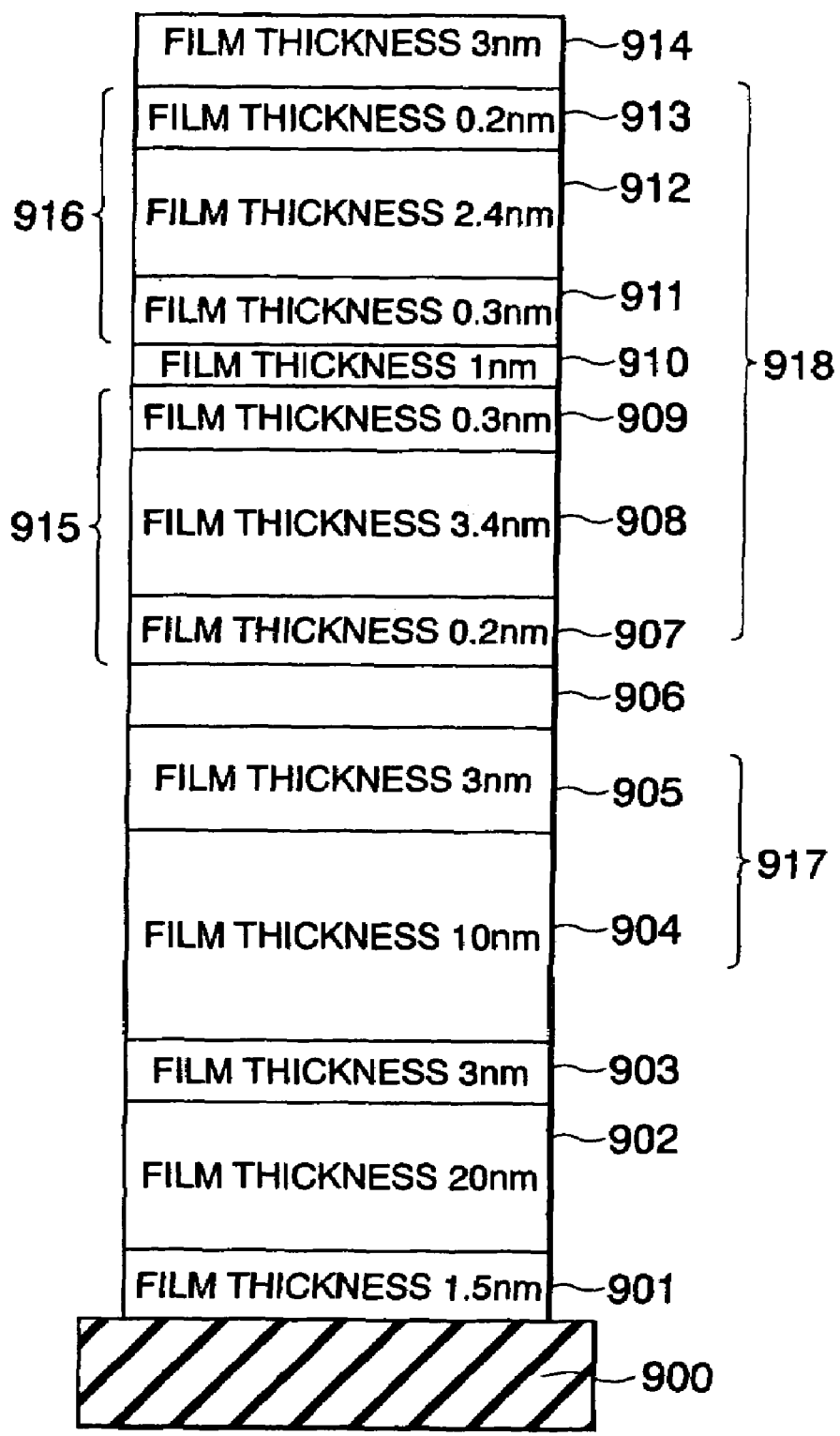
FIG. 20 is a cross-sectional view showing a basic film thickness of the ferromagnetic tunnel junction element according to the seventh example.

As shown in FIG. 20, the ferromagnetic tunnel junction element according to the seventh example has a basic structure including a thermally oxidized silicon substrate 900/a first Ta layer 901/an Al layer 902/a second Ta layer 903/an IrMn layer 904/a fifth CoFe layer 905/a tunnel barrier layer 906/a first CoFe layer 907/a first NiFe layer 908/a second CoFe layer 909/an Ru layer 910/a third CoFe layer 911/a second NiFe layer 912/a fourth CoFe layer 913/a third Ta layer 914.

A composition of each of the first NiFe layer 908 and the second NiFe layer 912 is $Ni_{0.8}Fe_{0.2}$ (Ni composition: 80 atom %). Further, a composition of each of the first CoFe layer 907 and the fourth CoFe layer 913 is $Cu_{0.3}Fe_{0.7}$ (Co composition: 30 atom %), and a composition of each of the second CoFe layer 909, the third CoFe layer 911 and the fifth CoFe layer 905 is $Co_{0.9}Fe_{0.1}$ (Co composition: 90 atom %). In regard to a film thickness of each layer, as shown in the drawing, the first Ta layer 901 has a thickness of 1.5 nm; the Al layer 902, 20 nm; the second Ta layer 903, 3 nm; the IrMn layer 904, 10 nm; the fifth CoFe layer 905, 3 nm; the first CoFe layer 908, 0.2 nm; the first NiFe layer 908, 3.4 nm; the second CoFe layer 909, 0.3 nm; the Ru layer 910, 1 nm; the third CoFe layer 911, 0.3 nm; the second NiFe layer 912, 2.4 nm; the fourth CoFe layer 913, 0.2 nm; and the third Ta layer 914, 3 nm. This is the structure which is of a type that the thermally oxidized silicon substrate is used as the substrate 800 in the fourth embodiment; Al, as the underlying electrode layer 802; Ta, as all of the first buffer layer 801, the second buffer layer 803 and the cap layer 813; $Cu_{0.3}Fe_{0.7}$, as the first ferromagnetic layer 806 and the fourth ferromagnetic layer 812; NiFe, as the second ferromagnetic layer 807 and the third ferromagnetic layer 811; $Co_{0.9}Fe_{0.1}$, as the first interface ferromagnetic layer 808 and the second interface ferromagnetic layer 810; and Ru, as the non-magnetic intermediate layer 809. As the non-magnetic layer 805, the tunnel barrier layer 906 which is an insulator is used. Furthermore, the pinned magnetic layer 804 has a two-layer structure including the IrMn layer 904/the fifth CoFe layer 905, and this is of a type (exchange biased type) which fixes the magnetization direction of the fifth CoFe layer by being combined with the IrMn layer as the antiferromagnetic material. It is to be noted that an oxide of Al is used for the tunnel barrier layer 906.

The first CoFe layer 907, the first NiFe layer 908 and the second CoFe layer 909 constitute the first free magnetic layer 915, and the third CoFe layer 911, the second NiFe layer 912 and the fourth CoFe layer 913 constitute the second free magnetic layer 916. The first free magnetic layer 915 and the second free magnetic layer 916 are magnetically coupled in such a manner that directions of magnetic moments thereof become anti-parallel to each other due to the anti-ferromagnetic exchange bonding effect through the Ru layer 910 and they function as the free magnetic layer The first free magnetic layer 915, the Ru layer 910 and the second free magnetic layer 916 as a whole serve as the free magnetic layer 918. A difference is provided to the magnetic moments of the first free magnetic layer 915 and the second free magnetic layer 916.

First, on the thermally oxidized silicon substrate 900 were formed a film of the first Ta layer 901 having a thickness of 1.5 nm, a film of the Al layer 902 having a thickness of 20 nm, a film of the second Ta layer 903 having a thickness of 3 nm, a film of the IrMn layer 904 having a thickness of 10 nm, and a film of the fifth CoFe layer 905 having a thickness of 3 nm. Subsequently, a film of Al having a thickness of 2.2 nm was formed as a metal layer serving as a tunnel barrier layer. The pure oxygen with 0.05 mTorr was introduced in vacuo, and a tunnel barrier layer 906 was formed by the oxidizing process (100 watt, 100 minutes) using a plasma gun. The introduced pure oxygen was completely exhausted, and the high-vacuum state was restored. Thereafter, a film of the first CoFe layer 907 having a thickness of 0.2 nm, a film of the first NiFe layer 908 having a thickness of 3.4 nm, a film of the second CoFe layer 909 having a thickness of 0.3 nm, a film of the Ru layer 910 having a thickness of 1 nm, a film of the third CoFe layer 911 having a thickness of 0.3 nm, a film of the second NiFe layer 912 having a thickness of 2.4 nm, a film of the fourth CoFe layer 913 having a thickness of 0.2 nm, and a film of the third Ta layer 914 having a thickness of 3 nm were formed thereon, thereby bringing the multi-layer thin film structure of the magneto-resistive effect element according to the sixth example to completion.

The thin film forming apparatus used in this example is a DC magnetron sputter apparatus including eight sputter targets each having a diameter of two inches, which is the same as that used in the first embodiment. A degree of vacuum in a film forming chamber was 5×10$^{-9}$ Torr, and an argon gas pressure during sputtering was 3 mTorr.

The finished ferromagnetic tunnel junction film was processed into a junction element shape by the same steps (FIGS. 19(a) to (g)) as those in the sixth example.

As to the finished ferromagnetic tunnel junction element, a resistance change in the magnetic field was measured by a direct current quadrupole method, and its characteristic was evaluated.

As the characteristic of the ferromagnetic tunnel junction element (bonding area=0.052 µm$^2$) according to the seventh example, the standardized bonding resistance was 0.9 MΩµm$^2$, the MR ratio was 39%, the reverting magnetic field of the free magnetic layer was 395 A/m (5 (Oe)) when the magnetic field was applied from the magnetization facilitating axis to the direction of 45 degrees, which are very preferable for the application to a high density solid-state magnetic memory (MRAM) or a high recording density compatible magnetic head. The ferromagnetic tunnel junction element according to this embodiment has the larger MR ratio and is more preferable than the ferromagnetic tunnel junction element according to the sixth embodiment.

As described above, according to the present invention, it is possible to readily manufacture the laminated ferrimagnetic thin film which can simultaneously realize the large anti-ferromagnetic exchange bonding energy which is suitable for the laminated ferri type free magnetic layer in the magneto-resistive effect element, and the excellent soft magnetic characteristic of the entire magnetic layer.

While this invention has thus far been described in conjunction with several embodiments and examples thereof, it will be readily possible for those skilled in the art to put this invention into practice in various other manners.

What is claimed is:

1. A laminated ferrimagnetic thin film, comprising:
a first ferromagnetic layer;
a second ferromagnetic layer; and
a non-magnetic intermediate layer which is arranged therebetween and in contact with the first ferromagnetic layer and the second ferromagnetic layer, the first ferromagnetic layer and the second ferromagnetic layer being magnetically coupled with each other through the non-magnetic intermediate layer in an anti-ferromagnetic manner,
wherein the first ferromagnetic layer comprises a first main ferromagnetic layer comprising at least one layer, and a first interface ferromagnetic layer which is arranged between and in contact with the first main ferromagnetic layer and the non-magnetic intermediate layer,
wherein the second ferromagnetic layer comprises a second main ferromagnetic layer comprising at least one layer, and a second interface ferromagnetic layer which is arranged between and in contact with the second main ferromagnetic layer and the non-magnetic intermediate layer,
wherein each of the first interface ferromagnetic layer and the second interface ferromagnetic layer comprises at least one of Co and a Co alloy,
wherein each of at least one layer in the first main ferromagnetic layer and at least one layer in the second main ferromagnetic layer comprises a soft magnetic layer having a coercive force smaller than that of each of the first interface ferromagnetic layer and the second interface ferromagnetic layer,
wherein a total film thickness of layers comprising the soft magnetic layers in the first main ferromagnetic layer comprises not less than 60% of a film thickness of the first ferromagnetic layer,
wherein a total film thickness of layers comprising the soft magnetic layers in the second main ferromagnetic layer comprises not less than 60% of a film thickness of the second ferromagnetic layer,
wherein said laminated ferrimagnetic thin film is a free layer in a magneto-resistive effect element, and
wherein the Co alloy comprises a $Co_xFe_{1-x}$ alloy, where $0.75 \leqq X < 1$.

2. The laminated ferrimagnetic thin film according to claim 1, wherein the non-magnetic intermediate layer comprises at least one of a metal selected from a group consisting of Ru, Rh, Ir and Cu, and an alloy having as a main component one of Ru, Rh, Ir and Cu.

3. The laminated ferrimagnetic thin film according to claim 1, wherein the Co alloy comprises a Co—Fe alloy.

4. The laminated ferrimagnetic thin film according to claim 1, wherein the soft magnetic film comprises at least one of Ni and an Ni alloy.

5. The laminated ferrimagnetic thin film according to claim 1, wherein the soft magnetic film comprises an Ni—Fe alloy.

6. The laminated ferrimagnetic thin film according to claim 1, wherein the soft magnetic film comprises an $Ni_xFe_{1-x}$ alloy, where $0.35 \leqq X < 1$.

7. A magneto-resistive effect element, comprising:
the laminated ferrimagnetic thin film according to claim 1, in which a magnetization direction is freely set with respect to an external magnetic field;
a pinned magnetic layer including a mechanism which fixes the magnetization direction with respect to the external magnetic field; and
a non-magnetic layer which is arranged between and in contact with the free layer and the pinned magnetic layer, an element resistance thereof being changed by application of an external magnetic field.

8. The laminated ferrimagnetic thin film according to claim 1, wherein the soft magnetic film comprises an $Ni_xFe_{1-x}$ alloy, where $0.35 \leqq X < 1$.

9. A laminated ferrimagnetic thin film, comprising:
a first ferromagnetic layer;
a second ferromagnetic layer; and
a non-magnetic intermediate layer which is arranged therebetween and in contact with the first ferromagnetic layer and the second ferromagnetic layer, the first ferromagnetic layer and the second ferromagnetic layer being magnetically coupled with each other through the non-magnetic intermediate layer in an anti-ferromagnetic manner,
wherein the first ferromagnetic layer comprises two layers of a first main ferromagnetic layer, and a first interface ferromagnetic layer which is arranged between and in contact with the first main ferromagnetic layer and the non-magnetic intermediate layer,
wherein the second ferromagnetic layer comprises two layers of a second main ferromagnetic layer, and a second interface ferromagnetic layer which is arranged between and in contact with the second main ferromagnetic layer and the non-magnetic intermediate layer,
wherein each of the first interface ferromagnetic layer and the second interface ferromagnetic layer comprises at least one of Co and a Co alloy,
wherein each of the first main ferromagnetic layer and the second main ferromagnetic layer comprises a soft magnetic layer having a coercive force smaller than that of each of the first interface ferromagnetic layer and the second interface ferromagnetic layer,
wherein a film thickness of the first main ferromagnetic layer comprises not less than 60% of a film thickness of the first ferromagnetic layer,
wherein a film thickness of the second main ferromagnetic layer comprises not less than 60% of a film thickness of the second ferromagnetic layer,
wherein said laminated ferrimagnetic thin film is a free layer in a magneto-resistive effect element, and
wherein the Co alloy comprises a $Co_xFe_{1-x}$ alloy, where $0.75 \leqq X < 1$.

10. The laminated ferrimagnetic thin film according to claim 9, wherein the non-magnetic intermediate layer comprises at least one of a metal selected from a group consisting of Ru, Rh, Ir and Cu, and an alloy having as a main component one of Ru, Rh, Ir and Cu.

11. The laminated ferrimagnetic thin film according to claim 9, wherein the Co alloy comprises a Co—Fe alloy.

12. The laminated ferrimagnetic thin film according to claim 9, wherein the soft magnetic film comprises at least one of Ni and an Ni alloy.

13. The laminated ferrimagnetic thin film according to claim 9, wherein the soft magnetic film comprises an Ni—Fe alloy.

14. A magneto-resistive effect element, comprising:
the laminated ferrimagnetic thin film according to claim 9, in which a magnetization direction is freely set with respect to an external magnetic field;
a pinned magnetic layer including a mechanism which fixes the magnetization direction with respect to the external magnetic field; and
a non-magnetic layer which is arranged between and in contact with the free magnetic layer and the pinned magnetic layer, an element resistance thereof being changed by application of an external magnetic field.

15. A laminated ferrimagnetic thin film, comprising:
a first ferromagnetic layer;
a second ferromagnetic layer; and
a non-magnetic intermediate layer which is arranged therebetween and in contact with the first ferromagnetic layer and the second ferromagnetic layer, the first ferromagnetic layer and the second ferromagnetic layer being magnetically coupled with each other through the non-magnetic intermediate layer in an anti-ferromagnetic manner,
wherein the first ferromagnetic layer comprises two layers of a first main ferromagnetic layer, and a first interface ferromagnetic layer which is arranged between and in contact with the first main ferromagnetic layer and the non-magnetic intermediate layer,
wherein the second ferromagnetic layer comprises two layers of a second main ferromagnetic layer, and a second interface ferromagnetic layer which is arranged between and in contact with the second main ferromagnetic layer and the non-magnetic intermediate layer,
wherein said laminated ferrimagnetic thin film is a free layer in a magneto-resistive effect element, and
wherein the Co alloy comprises a $Co_xFe_{1-x}$ alloy, where $0.75 \leq X < 1$.

16. A laminated ferrimagnetic thin film, comprising:
a first ferromagnetic layer;
a second ferromagnetic layer; and
a non-magnetic intermediate layer which is arranged therebetween and in contact with the first ferromagnetic layer and the second ferromagnetic layer, the first ferromagnetic layer and the second ferromagnetic layer being magnetically coupled with each other through the non-magnetic intermediate layer in an anti-ferromagnetic manner,
wherein the first ferromagnetic layer comprises a first main ferromagnetic layer comprising at least one layer, and a first interface ferromagnetic layer which is arranged between and in contact with the first main ferromagnetic layer and the non-magnetic intermediate layer,
wherein the second ferromagnetic layer comprises a second main ferromagnetic layer comprising at least one layer, and a second interface ferromagnetic layer which is arranged between and in contact with the second main ferromagnetic layer and the non-magnetic intermediate layer,
wherein a total film thickness of the first main ferromagnetic layer comprises not less than 60% of a film thickness of the first ferromagnetic layer,
wherein a total film thickness of the second main ferromagnetic layer comprises not less than 60% of a film thickness of the second ferromagnetic layer,
wherein said laminated ferrimagnetic thin film is a free layer in a magneto-resistive effect element, and
wherein the Co alloy comprises a $Co_xFe_{1-x}$ alloy, where $0.75 \leq X < 1$.

* * * * *